(12) United States Patent
Johnson et al.

(10) Patent No.: US 7,166,233 B2
(45) Date of Patent: Jan. 23, 2007

(54) PULSED PLASMA PROCESSING METHOD AND APPARATUS

(75) Inventors: Wayne L. Johnson, Phoenix, AZ (US); Eric J. Strang, Chandler, AZ (US)

(73) Assignee: Tokyo Electron Limited, Tokyo (JP)

( * ) Notice: Subject to any disclaimer, the term of this patent is extended or adjusted under 35 U.S.C. 154(b) by 526 days.

(21) Appl. No.: 10/076,099

(22) Filed: Feb. 15, 2002

(65) Prior Publication Data

US 2002/0160125 A1    Oct. 31, 2002

Related U.S. Application Data

(63) Continuation of application No. PCT/US00/21667, filed on Aug. 9, 2000.

(60) Provisional application No. 60/149,177, filed on Aug. 17, 1999.

(51) Int. Cl.
*C23C 16/00* (2006.01)
*H01L 21/306* (2006.01)

(52) U.S. Cl. ............. 216/67; 216/63; 204/192.32; 204/298.07; 204/298.33; 156/345.33; 156/345.34; 118/723 R; 118/723 E; 427/248.1

(58) Field of Classification Search .......... 204/192.12, 204/192.32, 298.07, 298.33; 216/63, 67; 118/723 R, 723 MP, 723 E; 427/248.1, 255.3, 427/255.23, 255.28; 156/345.33, 345.34

See application file for complete search history.

(56) References Cited

U.S. PATENT DOCUMENTS

| | | | |
|---|---|---|---|
| 3,677,799 A | 7/1972 | Hou | 427/569 |
| 3,721,583 A | 3/1973 | Blakeslee | 117/95 |
| 3,979,235 A | 9/1976 | Boucher | 117/102 |
| 4,058,430 A | 11/1977 | Suntola et al. | 427/255.13 |
| 4,263,088 A | 4/1981 | Gorin | 438/9 |
| 4,401,507 A | 8/1983 | Engle | 216/65 |
| 4,413,022 A | 11/1983 | Suntola et al. | 117/81 |
| 4,500,563 A | 2/1985 | Ellenberger et al. | 434/710 |
| 4,579,623 A * | 4/1986 | Suzuki et al. | 438/7 |
| 4,808,258 A * | 2/1989 | Otsubo et al. | 438/710 |

(Continued)

FOREIGN PATENT DOCUMENTS

EP     0 578 011 A1    1/1994

(Continued)

OTHER PUBLICATIONS

Bird, Molecular Gas Dynamics and the Direct Simulation of Gas Flows, Claredon Press, 1994, pp. 2-3.

(Continued)

*Primary Examiner*—Rodney G. McDonald
(74) *Attorney, Agent, or Firm*—Pillsbury Winthrop Shaw Pittman LLP

(57) ABSTRACT

In a method for performing a plasma-assisted treatment on a substrate in a reactor chamber by: introducing at least one process gas into the reactor chamber; and creating a plasma within the reactor chamber by establishing an RF electromagnetic field within the chamber and allowing the field to interact with the process gas, the electromagnetic field is controlled to have an energy level which varies cyclically between at least two values each sufficient to maintain the plasma, such that each energy level value is associated with performance of a respectively different treatment process on the substrate.

25 Claims, 20 Drawing Sheets

U.S. PATENT DOCUMENTS

| | | | | |
|---|---|---|---|---|
| 4,824,690 | A | 4/1989 | Heinecke et al. | 313/231.31 |
| 4,891,118 | A | 1/1990 | Ooiwa et al. | 204/298.34 |
| 4,935,661 | A | 6/1990 | Heinecke et al. | 313/231.31 |
| 4,993,358 | A | 2/1991 | Mahawili | 118/715 |
| 5,164,040 | A | 11/1992 | Eres et al. | 427/600 |
| 5,688,357 | A | 11/1997 | Hanawa | 156/345.28 |
| 6,089,181 | A | 7/2000 | Suemasa et al. | |
| 6,093,332 | A * | 7/2000 | Winniczek et al. | 216/2 |
| 6,277,756 | B1 * | 8/2001 | Ohara et al. | 438/700 |

FOREIGN PATENT DOCUMENTS

| | | |
|---|---|---|
| JP | 10-041281 | 2/1998 |

OTHER PUBLICATIONS

Gentry et al., "Ten-microsecond pulsed molecular beam source and a fast ionization detector," Rev. Sci. Instru, 49(5), May 1978, pp. 595-600.

Samukawa et al., "Pulse-time moduclated electron cyclotron resonance plasma etching for highly selective, highly anisotropic, and less-charging polycrystalline sililcon patterning," J. Vac. Sci. Technol. B 12(6), Nov./Dec. 1994, pp. 3300-3305.

Sugai et al., "Diagnostics and control of high-density etching plasmas," Mat. Res. Soc. Synp., Proc. vol. 406, 1996, pp. 15-25.

Yeon et al., "Study of particulate formation and its control by a radio frequency power modulation in the reactive ion process of SIO2 with CF4H2 Plasma" J. Vac. S ci. Technol. A 15(1), Jan./Feb. 1997, pp. 66-71.

Bates, et al., "Fast gas injection system for plasma physics experiements," Rev. Sci. Instrum. 55(6) Jun. 1984, pp. 934-939.

Otis et al., "A simple pulsed valve for use in supersonic nozzle experiments," Rev. Sci. Instru,. 51(8) Aug. 1980, pp. 1128-1129.

Cross et al., "High repetition pulsed nozzle beam source," Rev. Sc. Instrum. vol. 53 No. 1, Jan. 1982, pp. 38-42.

Kendall, "Pulsed gas injection for on-line calibration of residual gas analyzers," J. Vac. Sci., Technol. A 5(1), Jan./Feb. 1987, pp. 143-148.

Behlen et al., "Dynamics of radiationless processes studied in pulsed supersonic free jets: some naphthalene lifetimes," Chemical Physics Letters, vol. 60, No. 23, Jan. 15, 1979, pp. 364-367.

Saenger, "Pulsed molecular beams: a lower limit on pulse duration for fully developed supersonic expansions," J. Chem. Phys. 75(5), Sep. 1, 1981, pp. 2467-2469.

Bassi et al., "Pulsed molecular beam source," Rev. Sci. Instrum. 52(1), Jan. 1981, pp. 8-11.

Andressen et al., "Characteristics of a piezoelectric pulsed nozzle beam," Rev. Sci. Instrum. 56(11), Nov. 1985, pp. 2038-2042.

Balle et al., "A new method for observing the rotational spectra of weak molecular complexes: KrHCl," J. Chem. Phys. 72(2), Jan. 15, 1980, pp. 922-932.

Gentry et al., "Resolved single-quantum rotational excitation in HD+He collisions: first results from a unique molecular beam apparatus," Journal of Chemical Physics, vol. 67, No. 11, Dec. 1, 1977, pp. 5389-5391.

Ohtake et al., "Reduction of topography-dependent charging damage by the pulse-time-modulated plasma," 1998 Dry Process Symposium, V-1, pp. 97-102.

Matsui et al., "Effect of pulse modulated plasma on a charge build-up of the microscopic structure," 1998 Dry Process Symposium, V-1, pp. 85-90.

Ono et al., "Selectivity and profile control of poly-Si etching by time modulated bias method," 1998 Dry Process Symposium, V-1, pp. 141-146.

Ozeki et al., "Pulsed jet epitaxy of III-V compounds," Journal of Crystal Growth 107 (1991) 102-110 North-Holland, pp. 102-110.

Ozeki et al., "Growth of GaAs and AlAs thin films by a new atomic layer epitaxt technique," Thin Solid Films, 174 (1989), pp. 63-70.

Ozeki et al., "New approach to the atomic layer epitaxy of GaAs using a fast gas stream," Apply. Phys. Lett. 53 (16), Oct. 17, 1988, pp. 1509-1511.

Samukawa, "Highly selective and highly anisotropic SiO2 etching in pulse-time modulated electron cyclotron resonance plasma," Journal of Appl. Phys. vol. 33 (1994), Pt. 1, No. 4B, pp. 2133-2138.

LaBelle et al., "Effect of Precursors on the Properties of Pulsed PECVD Fluorocarbon Thin Films," NSF/SRC Engineering Research Center for Environmentally Benign Semiconductor Manufacturing Thrust—a Teleconference, Nov. 6, 1997, 23 pp.

U.S. Appl. No. 09/686,167, filed Oct. 12, 2000, Johnson.

U.S. Appl. No. 09/749,469, filed Dec. 28, 2000, Dandl et al.

U.S. Appl. No. 09/869,766, filed Jul. 2, 2001, Johnson et al.

U.S. Appl. No. 10/043,270, filed Jan. 14, 2002, Johnson et al.

* cited by examiner

PULSED PLASMA PROCESSING METHOD AND APPARATUS

This is a Continuation Application of International Application No. PCT/US00/21667, which was filed on Aug. 9, 2000, which is based on U.S. Provisional Application No. 60/149,177, which was filed on Aug. 17, 1999. The contents of both of these applications are incorporated by reference in their entirety.

BACKGROUND OF THE INVENTION

1. Field of Invention

The present invention relates to a mode of plasma assisted substrate processing in which a gaseous species is ionized, dissociated, or otherwise modified in a plasma and the modified species or a component thereof is caused to strike the substrate.

2. Prior Art

Over the past several decades, plasma assisted substrate processing has found increasing acceptance in a variety of industries, particularly within the semiconductor industry where the fundamental process steps include reactive ion etching (RIE), plasma assisted chemical vapor deposition (CVD), sputtering, reactive sputtering, and ion assisted physical vapor deposition (PVD). Processes that are currently employed in these industries generally operate in a continuous mode. That is, the only parameter that is varied, or modulated, with time, or temporally, is the radio frequency (RF) energy, which inherently varies at the RF excitation signal period.

In fact, temporal modulation of process parameters on a time scale that is small relative to the process time yet large compared with the RF period is limited to a few select areas of research. Temporal modulation of gaseous species is employed in atomic layer epitaxy (ALE) and pulsed jet epitaxy (PJE), a derivative of ALE, and more recently the temporal modulation of RF power has demonstrated improvements to selectivity purportedly as a result of electron temperature control.

The temporal modulation of RF power that has been studied and used simply involved the temporal modulation of the RF amplitude. It is conventional when treating periodic functions (of time) to represent these functions in discrete Fourier space, viz.

$$u(t) = \sum_{n=-\frac{N}{2}}^{\frac{N}{2}} A_n e^{i\omega_n t} \quad (1)$$

where $A_n$ is the Fourier amplitude and $\omega_n$ is the angular frequency ($=2\pi n f_0$). In general, the applied RF signal takes the above form wherein the Fourier harmonic amplitudes $A_n$ are independent of time. However, pulsed RF application has generally included $A_n = A_n(t)$.

The concept of pulsing gases in combination with pulsing the RF power in the performance of etching, deposition and related processes is disclosed, for example, in Heinecke et al., U.S. Pat. No. 4,824,690. This patent proposes a plasma reactor that allows for introducing different gases alternatingly, in a pulsating manner, into a processing chamber at an alternation rate which is on a time scale consistent with processing gas exchange rate and concurrently pulsing the RF power coincident with the beginning of each gas alternation cycle. The RF power is pulsed between off and approximately 60 kW with a pulse width of 50 to 500 msec (a duty cycle of approximately 0.1 to 1%) at the start of each gas introduction pulse. Heinecke et al., U.S. Pat. No. 4,935,661 discloses that the gas exchange rate can be improved by pulsing the gas admission under high pressure.

Although both of the above-cited Heinecke et al. patents are directed to deposition processes, they mention application of the disclosed technique to other processes such as etching.

As alluded to earlier herein, the temporal modulation of gaseous species spans several disciplines, including atomic layer epitaxy (ALE), chemical vapor deposition (CVD), molecular beam epitaxy (MBE), pulsed jet epitaxy (PJE), pulsed molecular beams, pulsed gas injection and pulsed gas valves. In the patent literature, three types of pulsed gas injection have been identified: pulsed jet; run/vent; and pulsed "train". Pulsed jet injection, as the name implies, is performed by controlling a gas injector in order to inject gas in the form of a series of discrete pulses. In a run/vent configuration, one or more gas streams are alternately switched between ("run") chamber injection or ("vent") exhaust. The exhaust or vent system must mimic the chamber conditions (i.e. pressure, etc.). Pulsed "train" gas injection uses a continuously flowing carrier gas into which different gases are cyclically introduced by periodic injection into the primary carrier gas, thus producing a gas "train" In order to minimize gas diffusion between adjacent species, the gas pulsing operates at a sufficiently low duty cycle to permit carrier gas to act as a diffusion barrier. In other words, when two or more different processing gasses are to be injected in alternation, flow of both or all processing gasses is blocked for a short period prior to injection of either gas into the carrier stream, thus separating successive doses of the two or more processing gasses from one another. These three types of pulsed gas injection are described, for example, in Blakeslee, U.S. Pat. No. 3,721,583; Boucher, U.S. Pat. No. 3,979,235; Suntola et al., U.S. Pat. No. 4,058,430; and Suntola et al., U.S. Pat. No. 4,413,022.

Often the exchange of gases during known ALE processes occurs under low pressure injection and over gas exchange periods sufficiently longer than the reactor gas residence time, i.e., several minutes to tens of minutes.

PJE is an extension of ALE and operates with supersonic jets at high rates. Several papers by Ozeki et al. correlate the use of high speed jets with gas exchange rates having periods as low as 100 msec. These papers include: New approach to the atomic layer epitaxy of GaAs using a fast gas stream, Appl. Phys. Lett., Vol. 53, p16, (1988); Growth of GaAs and AlAs thin films by a new atomic layer epitaxy technique, Thin solid films, Vol. 174 (1989); and Pulsed jet epitaxy of III–V compounds, J. Crys. Growth, Vol. 107 (1991). Further, Eres et al., U.S. Pat. No. 5,164,040, describes a PJE technique that employs an array of pulsed supersonic jets supplied by a source reservoir providing processing gas at a delivery pressure ranging from a few Torr to 200 Psi. Additionally, a plurality of jets that can be pulsed with any variation of frequency and phasing relative to each other.

Similar to ALE, the PJE technique promotes selective epitaxy and can produce highly uniform depositions.

Lastly, studies of pulsed molecular beams suggest the possibility of producing pulsed molecular beams with short temporal pulse widths and high repetition rates. Typically, the literature reports that pulsed molecular beams have been generated using high speed EM valves, some similar to car fuel injector valves, and piezo-electric devices. By way of example, technology of this type is described in the following papers: Gentry & Giese, Resolved single-quantum rotational excitation in HD+He collisions . . . , J. Chem. Phys., Vol. 67, p 11 (1977); Balle et al., A new method for observing the rotational spectra of weak molecular complexes . . . , J. Chem. Phys., Vol. 72, p2 (1979); Bassi et al., Pulsed molecular beam source, Rev. Sci. Instrum., Vol. 52, p1 (1981), Cross et al., High repetition rate pulsed nozzle beam source, Rev. Sci. Instrum., Vol. 53, p 38 (1982) and Andresen et al., Characteristics of a piezo-electric pulsed nozzle beam, Rev. Sci. Instrum., Vol 56, p 11 (1985). Results from time-of-flight (TOF) and UV laser induced fluorescence measurements indicate that pulse times as short as 50 μsec and repetition rates as high as 1000 Hz are achievable.

Pulsing the RF power to a plasma has been utilized primarily to enhance selectivity and/or uniformity, as well as to affect charging damage. The focus of prior work has been to temporally modulate the RF power between off and on, and thereby achieve improved selectivity and uniformity by tuning the pulse width and pulse repetition rate (PRR). In particular, it has been proposed in the art to temporally modulate the RF power in order to control the products of dissociation in the plasma and, in turn, control the reactants of the etch or deposition chemistry. In essence, pulsed modulation of the RF power reduces the electron temperature in an average sense over a pulse cycle, and hence directly affects the time average of the electron energy distribution. The degree, or rate, of dissociation and ionization of molecules within the plasma is proportional to the number of electrons and the collision cross-section, the latter being dependent upon the electron energy. Subsequently, one can control the chemical reactants for substrate processing by controlling the electron energy distribution within the plasma.

Hou et al., U.S. Pat. No. 3,677,799, describes using pulsed RF power to control boron coating deposition. Gorin et al., U.S. Pat. No. 4,263,088, discloses use of emission spectroscopy to determine the end of an etch process whereupon the RF power is switched from a continuous mode to a pulsed mode. Several other patents suggest pulsing the RF power on a time scale that is small compared with the time to significantly deplete reactants. See, for example, Engle et al., U.S. Pat. No. 4,401,507 and Ellenberger et al., U.S. Pat. No. 4,500,563. Such pulsing has been shown to enhance etch/deposition selectivity and uniformity.

More recently, the use of RF pulsing to control etch selectivity has been reported. Sugai et al., Diagnostics and control of high-density etch plasmas, Mat. Res. Soc. Symp. Proc., Vol 406, p 15 (1996), describes performance of advanced diagnostics on inductively coupled plasma reactors (ICP). Through variation of the pulse width, amplitude and repetition rate, improvements in the selectivity of $SiO_2$ to Si has been achieved by controlling the relative concentration of $CF_2$ to $CF_3$, CF and F. In fact, Samukawa, in Highly selective and highly anisotropic $SiO_2$ etching in pulse-time modulated ECR plasma, Jpn. J. Appl. Phys., Vol. 33(1), p 2133 (1994), identified a direct relationship between the ratio of $CF_2$ to F and the pulse duration. Moreover, Labelle et al., in Effect of precursors on the properties of pulsed PECVD fluorocarbon thin films, NSF/SRC Engineering Research Center for Environmentally Benign Semiconductor Manufacturing Thrust, A Teleconference, (Nov. 6, 1997), reports enhanced $CF_2$ ratios in work on pulsed PECVD fluorocarbon thin films.

In addition to improving selectivity in oxide etch processes, Samukawa et al., in Pulse-time modulated electron cyclotron resonance plasma etching for highly selective . . . , J. Vac. Sci. Technol. B, Vol. 12(6), p3300 (1994), discusses control of the ion energy spectra in poly-silicon etching using pulsed RF power. Yeon et al., in Study of particulate formation and its control by a radio frequency power modulation . . . , J. Vac. Sci. Technol. B, Vol. 15(1), p 66 (1997), claims to reduce particulate formation via RF modulation.

Furthermore, Ono et al., in "Selectivity and profile control of poly-Si etching by time modulation bias method", 1998 Dry Process Symposium (V1–5), p. 141–146, reported improved poly-Si to $SiO_2$ etch selectivity, improved etch anisotropy and suppressed micro-trenching phenomena when pulse modulating the chuck bias.

Lastly, Ohtake et al., in "Reduction of topography-dependent charging damage by the pulse time modulated plasma", Dry Process Symposium (V-1), p. 97–102, and Matsui et al., in "Effect of pulse modulated plasma on a charge build up of the microscopic structure, 1998 Dry Process Symposium (IV-2), p. 85–90, have investigated pulse modulated plasma with regard to the alleviation of topography dependent charging damage.

The concept of temporally modulating (or pulsing) the gas species or RF power delivered to a plasma is thus known. In fact, as already described, these concepts have been investigated extensively. However, known wafer processing technologies based on inductively coupled plasma (ICP) technology lack independent control of reaction chemistry and ion bombardment. For example, the plasma conditions necessary to produce optimal etch reactants via dissociation of a process gas are not the same as the conditions necessary for delivering optimal ion energy (and ion energy distribution) to the substrate.

Furthermore, known chamber configurations are incapable of making efficient use of reactive gases, or of efficiently removing volatile etch products.

BRIEF SUMMARY OF THE INVENTION

It is a primary object of the present invention to eliminate a number of limitations inherent in known wafer processing procedures based on inductively coupled plasma (ICP) technology.

A more specific object of the invention is enable independent control of process parameters in a direction to optimize different process stages for the purpose of improving etch selectivity and side wall profile.

A further specific object of the invention is to utilize pulsed gas and pulsed RF modulation to improve gas use efficiency and thus reduce pump speed requirements.

Another specific object of the invention is to utilize pulsed gas and/or pulsed RF modulation to enable a series (in time) of distinctly different process steps and to affect distinctly different conditions for a given process step wherein the series of process steps combine for a greater process treatment on a substrate.

The above and other objects are achieved, according to the invention, in a method for performing a plasma-assisted treatment on a substrate in a reactor chamber by: introducing at least one process gas into the reactor chamber; creating a plasma within the reactor chamber by establishing an RF electromagnetic field within the chamber and allowing the field to interact with the process gas; and causing the electromagnetic field to have an energy level which varies cyclically between at least two distinct values each sufficient to maintain the plasma, such that each energy level value produces, or is associated with performance of, a respectively different treatment process on the substrate.

DETAILED DESCRIPTION OF THE INVENTION

Figure 1A:
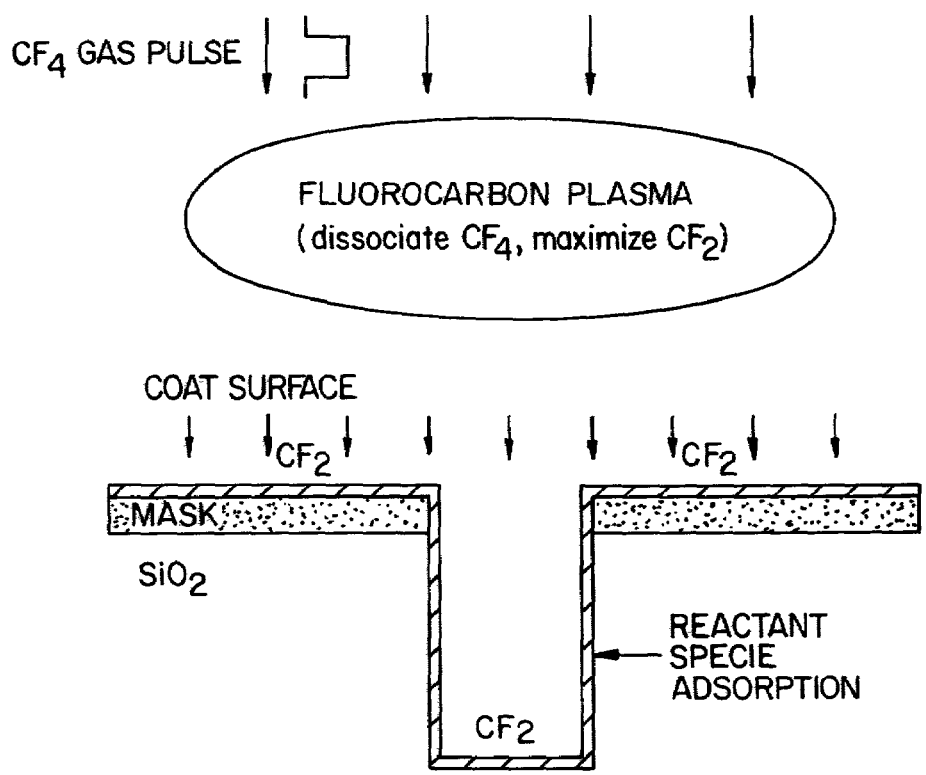
FIGS. 1A and 1B are diagrammatic elevational views illustrating two stages in a substrate etching process constituting one example of a process according to the invention.

According to one significant aspect of the present invention, the RF power delivered to a processing chamber, for maintaining a plasma is temporally modulated between two values. Each of these values is sufficient to maintain the plasma, and each power value produces, or is associated with performance of, a respectively different treatment process on the substrate.

In systems of the type here under consideration, the substrate is mounted on a chuck, or substrate holder, to which RF bias power is applied to produce a DC self-bias that acts to attract ions to the substrate surface. Hereinafter, RF power applied to an inductive coil (the preferable approach) or electrode opposite the substrate (as in a capacitive discharge) for the primary purpose of sustaining or generating a plasma will be referred to as RF source power. RF power applied to the chuck, or substrate holder, for the primary purpose of attracting ions from the plasma to the substrate surface will be referred to as RF bias power. Reference simply to RF power applies to situations which may apply to either one or both types of RF power.

Modulation of the RF source power and/or the RF bias power can produce improved results when the gas species is not varied during a procedure or when different gas species are introduced sequentially to each be present in the plasma when a respective power value is being delivered. Thus, there can be processes for which it may be desirable to pulse modulate the RF source power and the RF bias power, while maintaining a continuous flow of the same gas species or mixture of gas species. In other processes, it may be desirable to pulse the flow of gas into the chamber and the RF source power, while maintaining the RF bias power constant.

In preferred practical embodiments of the invention, the process gas being introduced into the chamber is varied between two species in a sequence that is coordinated with the temporal modulation of the RF source power. The purpose of this is to carry out two processes, in alternation, each using a different gas species. For many, if not most, processes of the type to which this invention is directed, it will also be advantageous, and in some cases necessary, to modulate the RF bias power applied to the chuck which supports the substrate being processed in order to improve plasma processing performance. This modulation will also be coordinated with the temporal modulation of the RF source power. Also, it may be desirable introduce a phase difference between the pulse modulations of the RF source power and the RF bias power and or between one or both of those modulations and the pattern in which the process gas introduction is varied. Thus, the modulation waveforms and process gas introduction pattern need not be in phase with one another, although an in-phase relation may be preferred for many procedures.

By "quickly" exchanging the two gas species in the plasma reactor, and concurrently modulating the inductively coupled radio frequency (ICRF) power that maintains the plasma, and possibly the RF bias power to the chuck, the two processes can be made to alternate at a comparatively high rate. Thus, the method is performed in a succession of cycles and each process is performed during a respective half-cycle of each successive cycle.

The present invention will be described in the context of one exemplary method, although it is to be understood that the invention is not in any way limited to that specific method. The exemplary method is employed for etching silicon dioxide, $SiO_2$.

The alternating gas species may be, for example, Ar and carbon tetrafluoride, $CF_4$, although other compositions such as CFCl and CHF can also be used. Ar and $CF_4$ each plays a different role in the etch process. Furthermore, the RF power would be pulsed between a low value, nominally <2 kW, and a high value, nominally 5 kW, consistent with the introduction of $CF_4$ and Ar, respectively. And lastly, the amplitude of the RF power delivered to the chuck is modulated to affect the DC self-bias voltage and, hence, the ion energy. It is envisioned that the switching between different gasses and the various modulations can be performed with a wide variety of patterns, or waveforms, and can take the form of amplitude and even phase modulation of the gas and RF components.

Phase modulation of the gas components involves establishing a fixed phase shift between each gas species and its respective RF power counterpart or counterparts. In the scenario presented, the RF power pulses and/or gas species pulses are rectangular in form; however, this is not necessarily the case. The waveforms may be periodic ramp or sinusoidal functions as in the linear superposition of two sinusoidal signals in phase at different frequencies $\omega+\Delta\omega$ and $\omega-\Delta\omega$ (separated by $2\Delta\omega$ where $\Delta\omega<<\omega$. In this case, one obtains a sinusoidal signal of frequency $\omega$ beating (or amplitude modulated) at frequency $\Delta\omega$ (i.e. a wave packet).

During each first half cycle of the method, $CF_4$, also designated Freon-14, which is an inert gas, is introduced into the plasma reactor. However, this form will be short-lived in the presence of the plasma where the inert $CF_4$ molecules can dissociate into various radicals such as $CF_3$, $CF_2$, CF, F, etc. Unlike $CF_4$, these radicals are somewhat reactive with oxide ($SiO_2$) when ion bombardment is added and produce volatile reaction products, i.e., $SiF_4$, $CO_2$, CO, all of which have vapor pressures that exceed the ambient chamber pressure. However, the interaction between photoresist (PR) and $SiO_2$ etch products can lead to the generation of complex Si organic build-up on the walls of the exhaust lines forming component parts of the reactor. Therefore, the exhaust lines should be heated in order to reduce this effect.

When $CF_4$ is introduced into the plasma, a reactive etch chemical process is initiated whereby the plasma activates the reactive radical species, and to a lesser extent the ions generated during this "low" RF power half-cycle can assist the substrate coating process and the reactive etch chemical process.

FIG. 1A presents a schematic representation of a first half cycle that involves introducing $CF_4$ process gas into a fluorocarbon plasma. As shown, the purpose of the fluorocarbon plasma is to dissociate $CF_4$ and maximize the production of $CF_2$, which is considered to improve selectivity to Si. This leads to coating the entire substrate and its associated PR mask with a uniform layer of $CF_2$ which is adsorbed onto the exposed $SiO_2$ surface and the PR mask. The substrate is mounted on a chuck (not shown) to which a DC self-bias potential is induced by the RF signal applied to the chuck and the plasma. Modulation of this RF bias produces a corresponding modulation of the DC self-bias, which contributes to an optimal coating of the substrate.

It is believed that the $CF_2$ coating serves two purposes when subsequently exposed to a highly directive, energetic ion bombardment: (i) it protects the PR mask so as to provide etch selectivity to PR, and (ii) it etches the $SiO_2$. The latter provides etch selectivity of $SiO_2$ to Si due to fluorine deficiency. Furthermore, the sidewalls of grooves or microtrenches being formed by the etching process are etched minimally or not at all due to the directivity of the ion bombardment.

At the end of each first half-cycle, $CF_4$ and its dissociation products are evacuated from the reactor chamber.

Figure 1B:
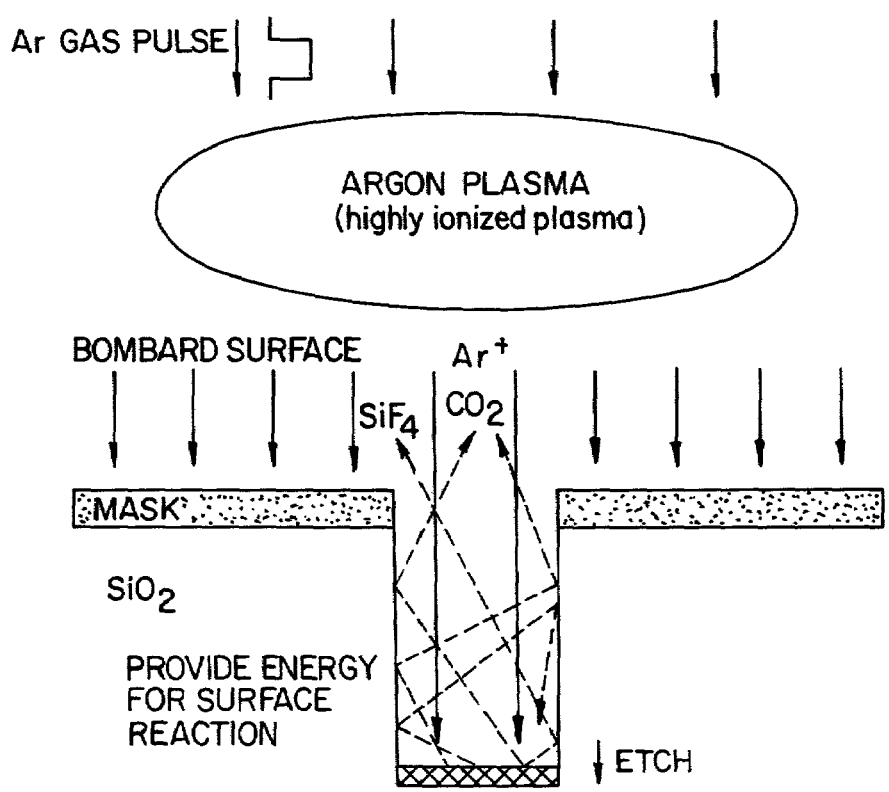

In each second half-cycle, depicted in FIG. 1B, Ar is introduced into the processing chamber for performance of a different process. The RF power delivered to the source is increased to produce a highly ionized Ar gas plasma and a high ion current in the source. A corresponding increase in the RF bias power applied to the chuck enables delivery of highly energetic Ar ions to the substrate surface, i.e., causes these ions to impact the surface forcefully and provides energy for surface reaction with $SiO_2$. Furthermore, ion bombardment can possibly damage the surface lattice structure for the next ensuing reactive cycle, clean the etched surface of contaminants, and aid the production of a highly anisotropic etch.

Similar to the concept of ALE (building one atomic layer per gas cycle), one or more mono-layers can be removed per cycle. Therefore, the half-cycles should alternate at a high rate in order to achieve a satisfactory etch rate. For example, if one were to assume that, on a statistical average, a single monolayer is removed during each cycle of the oxide etch method, then it can be concluded that the etch rate, in μm/min, is linearly proportional to the reciprocal of the period, τ, of each process half-cycle. It has been observed that a $SiO_2$ crystal lattice monolayer has a thickness of about 3–10 Angstroms (Å). This would suggest that an etch rate of 1 to 3 μm/min can be achieved with a modest pulse period of τ~10 msec, assuming that on a statistical average one monolayer is etched per process cycle. If the pulse period can be reduced to τ~1 msec, it may be possible to achieve an etch rate of 10 to 20 μm/min.

In summary, the invention presents a method for substrate processing based on temporal modulation of several process components. Moreover, through the temporal modulation of gas species, process type, RF source power and RF bias power, one or several parameters, including chemical reactants, reactant concentration at the wafer, ion density, ion energy and the spectral distribution of ion energy, can be adjusted to control etch performance, in particular etch selectivity.

The rapid exchange of gaseous species can serve several purposes. In the preferred embodiment described above, each of the two gases, Ar and $CF_4$, plays a different role in the etch process. Ar is used for ion bombardment and $CF_4$ is used for performance of a reactive chemistry process. Of course, there is no limitation on the number of different gases that can be sequentially introduced, (i.e., individual gases, pre-mixed gases, etc.), outside of the constraints placed upon access to the reactor. Similarly, each gas species may play different process roles, depending on selection of the other process parameters, and different gases may be introduced to produce different deposition layers on a substrate.

The exchange, or modulation, of gases in the above-described etch process is directly coupled with the RF source power modulation. For example, the source would be driven at a "low" power during $CF_4$ gas injection since it is desired to have the plasma act as a dissociating mechanism. However, a "high" power is most likely desirable to generate a highly ionized plasma for ion bombardment of the substrate. The terms "low" and "high" are, of course, relative and do not, by themselves, identify quantitative values. However, they do have significance to those skilled in the art, who will readily understand the range of quantitative values that would be encompassed by each term in the context of a specific process. As noted earlier herein, there is no limitation to the form of the pulsed RF waveform delivered to the plasma source. The concept of the present invention allows for complex amplitude modulation and phase modulation relative to the gas exchange waveform.

Coupled with gas exchange and RF source power modulation is the modulation of the RF bias power delivered to the chuck. Similarly, the inventive concept encompasses complex amplitude modulation and phasing of the RF bias power delivered to the chuck relative to the other process parameters. Furthermore, there may be control of the harmonic content of the RF signal delivered to the chuck during substrate processing. The details of each of the above-mentioned parameters will be discussed below.

The following description is directed to considerations involved in the construction of reactors for practicing the present invention. These reactors are designated pulsed mode etch (PME) reactors. In particular, fundamental limitations of such reactors, at least in the present state of the art, such as the rates at which gases can be exchanged, the rates at which the plasma density and ion energy by self-bias can be modulated with maximum RF power transfer to the plasma source or chuck, etc., will be discussed.

Earlier herein, the term "quickly" was used to identify the rate of gas species exchange and a half-cycle pulse width of the order of 1 msec was mentioned. This represents a desired order of magnitude for achieving moderate to high etch rates. Of all the parameters relevant to the pulsed mode processing according to the invention, the rate at which different gas species can be exchanged within the reactor chamber is the fundamental limit placed upon the achievable etch rate.

One approach to maximizing etch rate is to minimize reactor chamber volume and maximize reactor chamber gas flow conductance. This subject will be discussed in greater detail below. However, there are minimum limitations placed upon these parameters to make substrate processing sensible, i.e. to satisfy the needs of the plasma chemistry, etch chemistry, etc. Furthermore, there is a maximum limit to the rate at which gas can be pumped out of the chamber. For example, the highest pumping capacity presently attainable is of the order of 5000 liters/sec, produced by certain turbo-molecular pumps. An alternative approach would be to provide several lower capacity pumps, such as those capable of pumping 3300 liters/sec. However, only a small number of these pumps can be arranged to provide useful pumping at the reactor chamber.

The following discusses the fluid mechanical conditions of gas pumping and identifies attainable gas exchange rates for a semi-conventional chamber, a chamber which is conventional only with respect to the approximate size of the plasma source and the essential components present, i.e., chuck, injection plate, pump, etc.

Consideration should first be given to the neutral flow conditions that will be encountered at low pressures. Herein, low pressures will be assumed to be chamber pressures ranging from 1 to 1000 mTorr. However, the operation of a PME reactor is not limited to this range of pressure. At these low chamber pressures, the behavior of the gas begins to assume the traits of a free molecular flow, and no longer acts solely as a continuum fluid that obeys the Navier-Stokes equations for momentum transport. In order to determine the extent to which a gas behaves as a free molecular flow or a continuum fluid, one must assess the Knudsen number, Kn, which is simply the ratio of the mean free path to a gradient length scale in the flowfield. The gradient length scale can be a characteristic free shear layer thickness or a characteristic boundary layer thickness. However, this is generally replaced with a characteristic length scale taken from the flowfield, usually the respective geometry. Hence, a definition of Kn becomes $Kn=\lambda/L$ where $\lambda$ is the mean free path and L is a characteristic length of the flowfield.

Interpretation of the onset of free molecular flow is dependent upon which length scale one chooses to compare with the mean free path. Commonly, a value of the Knudsen number greater than unity is used as a criterion to identify the onset of free molecular flow. For example, at a chamber pressure of 10 mTorr, the mean free path is approximately 0.5 cm. When compared to the characteristic dimensions of the chamber, the Knudsen number is much less than unity; however, when compared with an orifice diameter, it is greater than unity. Thus, the conditions for free molecular flow are dependent upon the "scale" of interpretation.

Since the mean free path, to the first order, varies as the inverse of the pressure, it then follows that Kn varies inversely with the pressure and, of course, the characteristic length scale. Firstly, a global Kn may be derived based upon the effective diameter of the reactor that defines the "global" or large-scale gas dynamics. For L~20 cm, Kn varies between 0.00025 and 0.25 over the above-mentioned chamber pressure range of 1 to 1000 mTorr. However, when one considers the gas dynamics on a smaller scale, i.e. downstream of the gas injection orifices (on a scale comparable to the orifice diameter) or near the substrate, one must re-evaluate Kn and define it locally with the appropriate length scale (a gradient scale over which the macroscopic properties of the flow vary). For example, at a pressure of 10 mTorr, the global Kn would be approximately 0.025, Kn at the orifice exit plane may be approximately of order 0.1 for a mass flow of 500 sccm, and the local definition of Kn shortly downstream of the orifice (~1 cm) may be of order 5. In general, a value of Kn greater than unity indicates a free molecular flow regime, and a value of Kn less than 0.01 indicates a continuum flow regime. Many plasma assisted processes occur in the transition regime 0.01<Kn<1 (at least on a global scale), where neutral flow dynamics can become very complicated for most low pressure processes.

Without going into the details of Boltzmann equation solutions (using DSMC, Direct Simulation Monte Carlo) and Navier-Stokes solutions of molecular gas dynamics and continuum fluid dynamics, respectively, valuable insight can be obtained from simple first order analyses of the limiting cases: Kn→(infinity) and Kn→0 (or in practice, Kn>>1 and Kn<<1). When Kn<0.01, the gas behaves as a continuum fluid and its motion is governed by the Navier-Stokes equations; however, the applicability of the Navier-Stokes equations to a low pressure field is generally acceptable up to Kn~0.1. see Bird, G. A., Molecular *Gas Dynamics and the Direct Simulation of Gas Flows*, Clarendon Press, Oxford, 1994.). As Kn decreases further below a value of 0.01 the flow becomes isentropic outside of viscous layers and may be treated with the Euler equations (a reduced form of the Navier-Stokes equations excluding the viscous stresses).

Figure 2A:
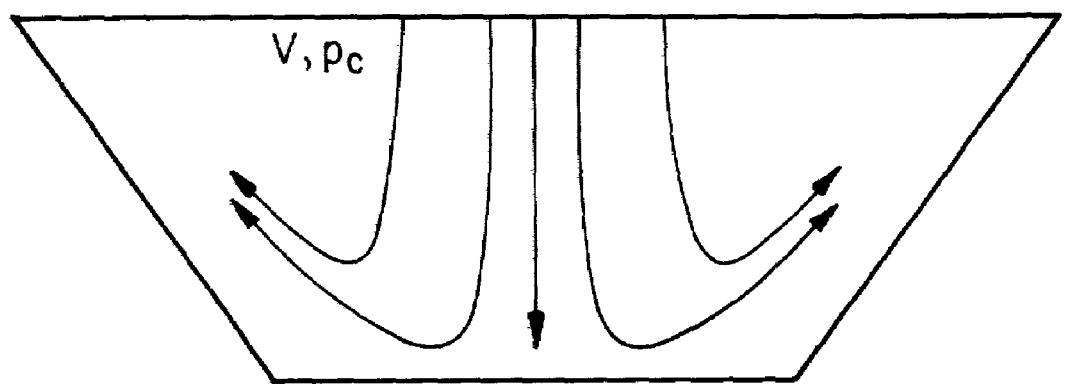
FIGS. 2A and 2B are schematic diagrams illustrating gas flow patterns under two different flow conditions in a plasma processing chamber having an inverted conical side wall.

If one assumes a chamber geometry as shown in FIG. 2A, where gas enters from a top injection plate, impinges upon the substrate and exhausts through a top plane adjacent to the injection orifices, then one might expect the streamlines to be as presented in the steady state. In a stationary flow, all averaged properties are independent of time and, hence, a time average is equivalent to an ensemble average as a result of the Theorem of Ergodicity. Subsequently, the streamlines shown in FIG. 2A are representative of the mean flow whereby the fluctuations are removed in an average sense. These fluctuations may be attributed to the cyclical pulsation of gas into the chamber and the ensemble average would become a phase average. The high pulse rates and the continuous train of pulses, as shown in FIG. 2A, can be construed as a stationary flow upon phase averaging, or time averaging.

If the flowfield can be assumed to be stationary, i.e., over a period where the chamber pressure tends to a constant value, then the mass flow into the system must balance the flow rate exhausting from the system. That is, if we define a control volume to enclose the reactor volume, then the mass flow entering the chamber $\rho^* u^* A^*_r$, must balance the mass flow leaving the chamber $\rho_c S$; where $\rho^*$ is the gas density at the entrance to the chamber, $u^*$ is the gas velocity at the chamber entrance, $A^*_t$ is the total orifice area ($A^*_t = NA^*$; N=the number of orifices, and $A^*$=orifice area), $\rho_c$ is the chamber gas density, and S is the chamber pump speed at the exhaust plane.

Figure 3:
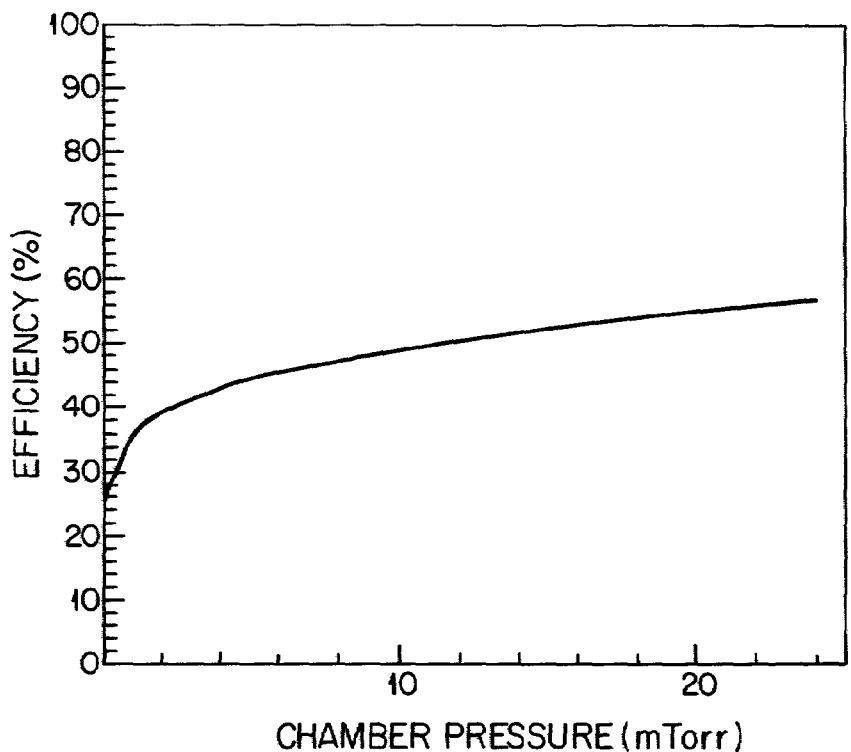
FIGS. 3 and 4 are diagrams illustrating variations in different operating parameters within a plasma processing chamber.

The pump speed S at the exhaust plane of the processing chamber is assumed to be approximately $S=(CS_{inlet})/(C+S_{inlet})$, where C is the flow conductance between the pump inlet and the chamber exhaust plane (dependent upon the chamber geometry and the pressure between these two points), and $S_{inlet}$ is the pumping speed at the pump inlet, i.e. the volume flow rate at the pump inlet, which is dependent upon the inlet pressure. C, S and $S_{inlet}$ are all in units of gas volume per unit time. In, for example, FIG. 14B, the chamber exhaust plane is the plane of injection plate 18' and the pump inlet plane is represented by line 21. A typical efficiency curve (i.e. $E=S/S_{inlet}$) is shown in FIG. 3. In the continuum limit, the mean pressure field "pushes" consecutive pulses through the chamber.

Figure 4:
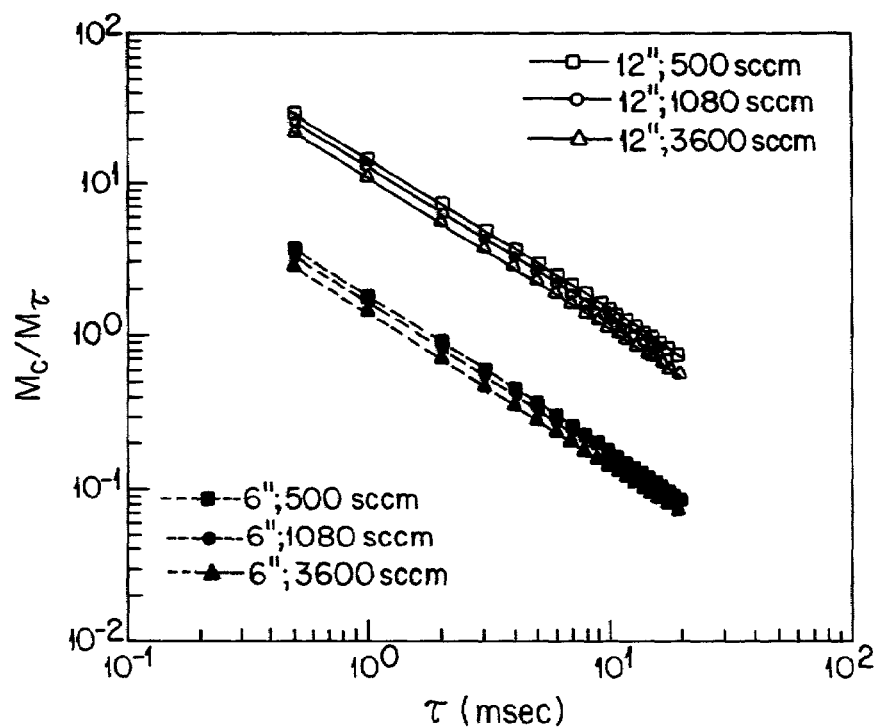

FIG. 4 shows the ratio of mass entering the chamber (in a pulse length of time τ, i.e., one half cycle) to the mass existing within the chamber at the given chamber pressure. The condition when the ratio becomes a value of unity or less defines a critical gas exchange rate in the continuum limit. There are two family of curves in FIG. 4; one, shown in solid lines, shows ratio values for gas exchange in a large semi-conical chamber with dimensions 35 cm base diameter, 62 cm top diameter and 17 cm chamber height, H; and the second one, shown in broken lines, shows ratio values for gas exchange in a small semi-conical chamber with dimensions a factor of two smaller than those associated with the first set of curves. FIG. 4 shows that, depending on the inlet mass flow, the minimum gas pulse width τ varies by as much as 30%. This mass flow variation is simply attributed to improved pumping efficiency at higher pressures. In the smaller chamber, for processing a 6 in. substrate, the minimum pulse time can be as short as 1.5 msec. Tuning of the gas injection to improve gas exchange rates in the chamber will be discussed below.

Figure 2B:
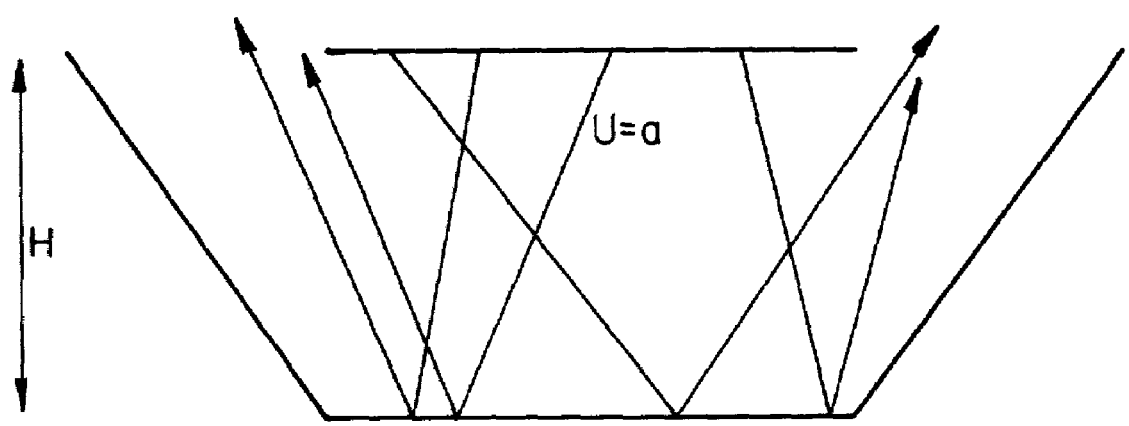

In the limit Kn>>1, molecules would be expected to travel through the chamber to the exhaust plane where wall collisions dictate the direction of their travel, i.e., their mean free path is large relative to the chamber geometry. A gas molecule would be expected to have the shortest travel time when it travels through the chamber to the substrate without collision, elastically collides with the substrate surface and bounces to the exhaust plane where it departs the chamber. This situation is shown in FIG. 2B. With this assumption, it is conceivable that the minimum residence time of a gas molecule is approximately 2H/a where H is the chamber height and a is the speed of sound at room temperature. This would give an estimated minimum residence time $\tau_r$, of 0.6 msec for the smaller chamber defined above. In order to determine residence time, it is necessary to track the paths of several particles to determine the probability distribution function (PDF) for the residence time, i.e. using a DSMC approach, wherein "several" particles denotes a number sufficient to obtain a statistical average of events. The average residence time may be of order the continuum time scale or even larger.

However, the discussion presented above does not yet include the complicating features of plasma. In the presence of a plasma, several first order effects on the neutral flow can be observed. One important feature of plasma may be ion-neutral pumping wherein ion transport can directly and indirectly affect neutral transport within the chamber. Firstly, ions generated, for example, by the excitation of an ionizable gas via RF power application, flow to the walls under the application of an electrostatic force directly proportional to the plasma potential gradient continuously varying from the plasma to the boundary surface (wherein the primary potential gradient occurs across the sheaths). Upon collision with the walls, ions recombine with electrons to form a neutral species at the wall. Therefore, neutral particles are effectively ionized and transported to the wall via electrostatic forces, whereupon they recombine. Secondly, as ions are transported to the wall, they can exchange outward flowing momentum to existing neutral particles, hence redirecting them outward, or, in essence, pumping neutral particles. However, the significance of either pumping effect relies directly upon the chamber pressure and, more importantly, the mean free path. This effect is greatly simplified and includes just one effect within the complication of plasma that introduces the effects of ionization, dissociation, recombination, gas heating, wall adsorption, wall polymerization, etc.

The complicating features of a plasma coupled to the neutral flow will certainly affect the residence time and possibly increase it from the ideal case. However, the above exchange rates can be reasonable estimates based upon simple physics, at least in the sense of providing the minimum possible residence time attainable. In summary, conventional chambers may be capable of achieving gas exchange rates of order τ~10 msec. With vacuum designs tailored for maximizing pumping speed at a bounding surface of the process volume and methods implemented for high speed directed gas injection, it may be possible to achieve 1 msec (and possibly sub-msec) performance.

If, as suggested earlier herein, the gas injection system is to produce gas pulses approximately 1 msec in length, i.e. the period τ during which each gas species is being introduced has this duration, then the frequency, $f=\frac{1}{2}\tau$, of cyclic operation of the gas injection system would be 500 Hz. This demand on a gas injection system is quite substantial but feasible in light of results that have been achieved in the field of supersonic pulsed gas injection for plasma experiments.

Design of a pulsed gas injection system having this capability requires consideration of the gas dynamics of continuous and pulsed gas systems entering a low pressure environment, methods of gas pulse actuation, and principles of gas valve design. The following discussion relates primarily to a preferred form of construction for the gas injection system, but also covers alternative solutions.

It will be appropriate to first understand the gas dynamics of a continuous flow injection system and then consider the applicability of this understanding to the unsteady dynamics of a pulsed gas injection system. Firstly, the low pressure environment into which the gas is to be injected spans approximately, but is not limited to, $1<P_c<1000$ mTorr and the source total pressure $P_t$ spans the range $0.1<P_t<100$ Torr. The total pressure is the stagnation pressure of the gas within the gas plenum residing behind the inject plate, i.e. the gas pressure when a gas velocity is isentropically reduced to zero). The term total pressure commonly refers to the summation of the static pressure and the dynamic pressure. Across these pressure ranges, the gas dynamics can change significantly due to the dependence of the Knudsen number on the local pressure and, moreover, as described earlier, the resultant transition from a continuum flow to a free molecular flow, which is a consequence of the relatively large Kn.

At the upper end of the pressures previously mentioned ($P_t>10\sim100$ Torr), the gas flow through an injection orifice (0.5 mm in diameter) encounters a sufficient number of collisions that the flow behaves in a continuum manner and can be well represented using the Navier-Stokes equations. Furthermore, the Knudsen number is sufficiently small, or the Reynolds number is sufficiently large, that a region of the continuum orifice flow may be regarded as isentropic and subsequently obeys a reduced form of the Navier-Stokes equations, namely, the Euler equations.

When these conditions exist and when the pressure ratio across the orifice, i.e., the ratio of the inlet total pressure to the ambient pressure beyond the exit of the orifice, is sufficiently large, the orifice reaches a "choked" condition. In the choked condition, the volume flow rate is invariant with either further reduction of the back pressure (a term that is well-known in this art), in this case, the chamber pressure, or increase of the inlet total pressure. In fact, the mass flow through the orifice can only be increased further by increasing the inlet total pressure, hence affecting the gas density. This assumes, of course, that changing the throat, or orifice, area is not tenable.

When the orifice becomes choked, the Mach number (ratio of the local velocity to the local speed of sound) takes on a value of unity at the orifice throat (smallest cross-sectional area); for a constant area orifice, the throat occurs at the orifice exit plane due to frictional effects. Once the flow is sonic at the throat, it accelerates to supersonic speeds (M>1) when it experiences an increase in area (unlike a subsonic flow that decelerates during an area enlargement). Now, once the flow becomes supersonic, the flow characteristics or rays of pressure wave propagation become real and are identifiable as Mach waves (expansion) and shock waves (compression). Their direction of propagation are limited to a domain of influence, wherein a point within the entire domain can only affect the region that is downstream of that point and bounded by the left and right running characteristics that intersect at that point. This is a consequence of the hyperbolic nature of the governing equations when M>1.

Therefore, by way of summary, it can be stated that when M>1, pressure waves can not propagate back upstream through the orifice and influence the incoming flow, i.e. volume flow rate or mass flow rate when the inlet total pressure is held fixed.

Figure 5:
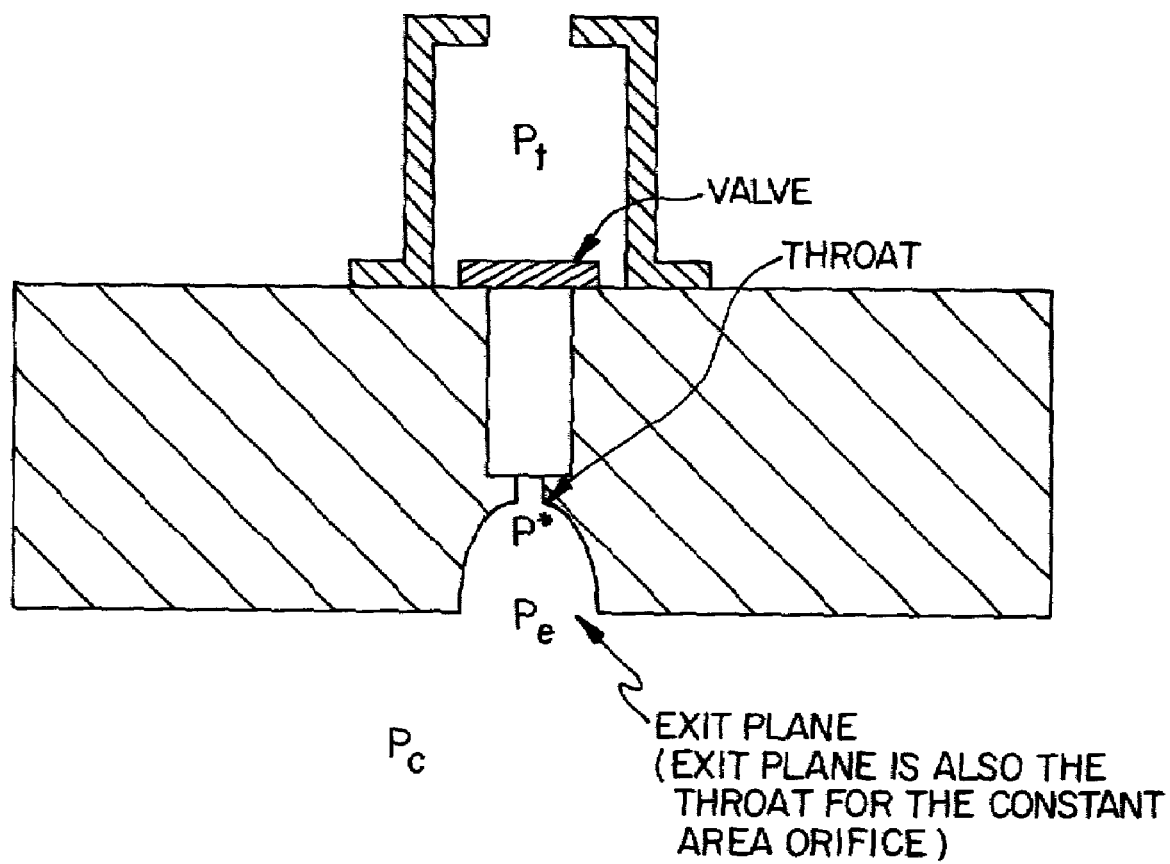
FIG. 5 is a cross-sectional view of a first embodiment of a gas injection system according to the invention.

FIG. 5 presents a schematic of an injection orifice that includes a constant area orifice entering a divergent nozzle. The schematic indicates the locations for the varying pressure field definitions, including the source total pressure $P_t$, the orifice throat pressure $P^*$, the orifice exit pressure $P_e$ and the chamber pressure $P_c$. For a constant area orifice (i.e., with no divergent section), the throat pressure is equivalent to the exit pressure.

Figure 6A:
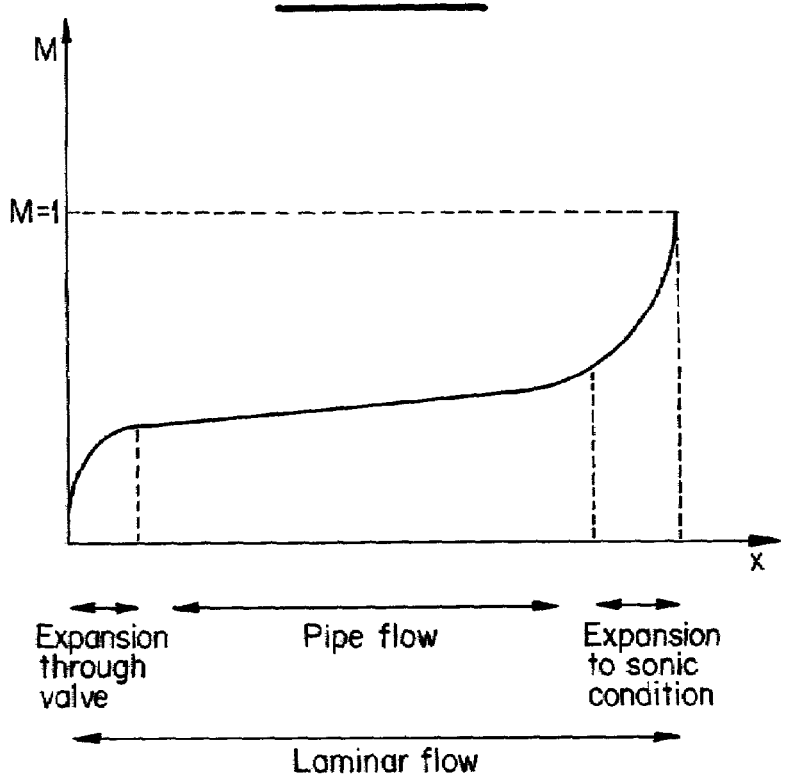
FIGS. 6A, 6B and 7 are diagrams illustrating various flow parameters in a plasma processing system according to the invention.
Figure 6B:
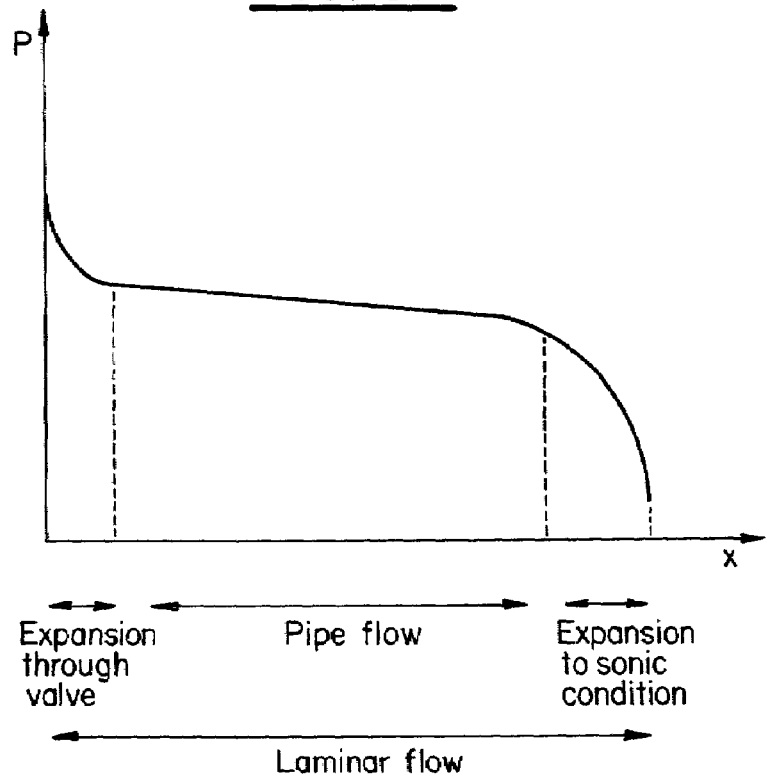
Figure 7:
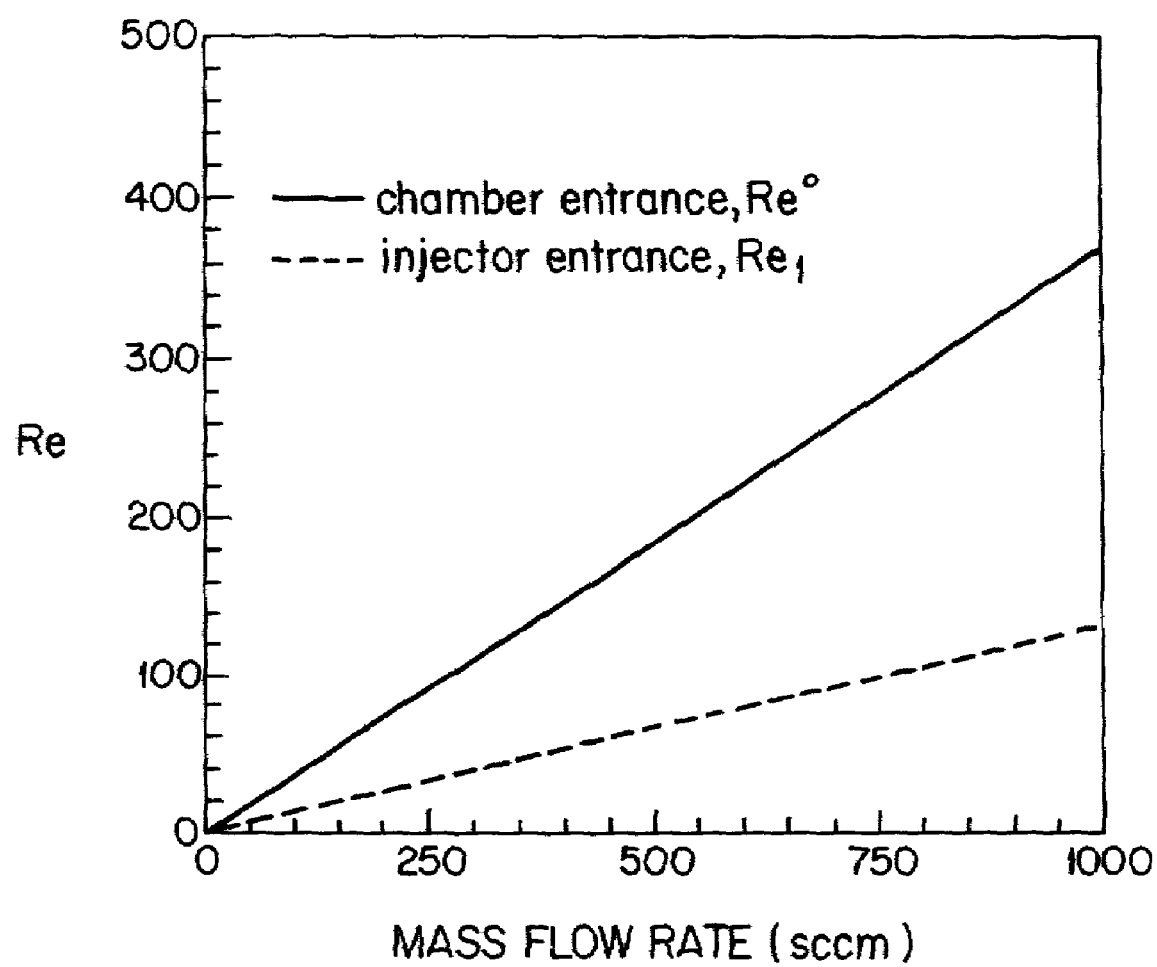

An example of the Mach number and static pressure variations along a constant area injection orifice are shown in FIGS. 6A and 6B, respectively. Clearly, the gas is accelerated to a sonic condition (M=1) over the last 20% of the injection length, with a corresponding drop in the static pressure during this expansion. Under the conditions associated with a constant area orifice, the gas undergoes an abrupt transition from a continuum flow to a free molecular flow within several (5–10) orifice diameters downstream of the orifice in the vacuum chamber.

In general, the ratio of the source total pressure to the chamber pressure exceeds the critical pressure ratio by 1 to 2 orders of magnitude. Consequently, the throat pressure, or exit pressure for a constant area orifice, is significantly larger than the ambient chamber pressure. This is commonly referred to as an under-expanded condition. In order to achieve a pressure-matched condition, where the exit pressure is equal to the ambient chamber pressure, a properly designed area enlargement, or divergent nozzle, is utilized. This condition can exhibit the properties of a uniform, directed gas jet entering the low pressure environment. However, when a divergent nozzle is utilized, a rising Kn, due to the gas expansion, is again encountered. It is therefore conceivable to observe transition flow effects.

Midway through the pressure range mentioned above ($0.5 < P_c < 10$ Torr), viscosity plays a growing role in the gas flow through the orifice and, ultimately, there exists no region within the flowfield that may be treated as isentropic. In fact, at the low end of this pressure range, the total pressure losses through the orifice due to viscous effects may be sufficiently high to sustain the apparent pressure ratios across the orifice. Under these conditions, the orifice may not choke. At lower pressures, collisions taking place within the orifice will become more infrequent to the extent that the gas flow may exhibit the behavior of a free molecular flow. Then, macroscopic properties in the continuum sense can no longer adequately describe the behavior of the flow.

In summary, the conditions for gas injection are best understood at higher pressure wherein the assumption of continuum behavior, and ideally isentropic, continuum behavior, is made. Particularly, when higher mass flow rates are achieved, one can attain a higher source total pressure, i.e. a mass flow rate of 500 to 1000 sccm and greater. An inherent advantage to operation under these conditions is the production of highly directive gas jets that may be organized to coalesce upon impinging on the substrate. Furthermore, they may be designed to transition to a free molecular flow at the exit plane. A gas injection design of this nature can enable greater transport rates and can decrease the chamber gas exchange rates.

The above discussion has illuminated some advantages of high pressure gas injection. In fact, high pressure gas injection used in consonance with low pressure processing will, in general, require high mass flow rates or throughput. Therefore, it is desirable to optimize and ultimately increase the pumping speed at the exhaust plane, or wafer plane, of a process reactor. This can be done with a large turbomolecular pump and good vacuum design between the pump inlet and process volume. Further improvements will be possible as improved pumping methods are developed.

Up to this point, only a continuous orifice flow, i.e., steady flow, has been considered. However, the concept of pulsed gas injection has been introduced herein. At higher pressures, when the orifice flow behaves as a continuum flow that is isentropic, the minimum pulse time should exceed the sum of the time required to accelerate the gas from a stagnant condition to a sonic condition, the time required to establish a region of a sufficient number of molecules to undergo an expansion and a time sufficiently long that the gas pulse density is unaffected by the velocity dispersion at the beginning and end of the pulse (see Saenger, K. L. "Pulsed molecular beams: A lower limit on pulse duration for fully developed supersonic expansions", J. Chem. Phys., Vol. 75, No. 5 (1981)). For example, at $P_t \sim 200$ Torr, the minimum pulse time is of order 10 μsec. This is sufficiently less than 1 to 10 msec.

There are several methods presently available for actuating a gas pulse for this injection system, bearing in mind the desired pulse width and pulse frequency. Some examples are the use: of electromagnetic valves wherein a capacitor is rapidly discharged, as described in Gentry & Giese, Ten-microsecond pulsed molecular beam source and a fast ionization detector, Rev. Sci. Instrum., Vol. 49, no. 5, p 1888, (1978); automotive fuel injector valves that have been modified for similar purposes, as described in Kendall, Pulsed gas injection for on-line calibration of residual gas analyzers, J. Vac. Sci. Technol. A, Vol. 5, No. 1 (1987), Otis & Johnson, A simple pulsed valve for use in supersonic nozzle experiments, Rev. Sci. Instrum., Vol. 51, No. 8 (1980), and Behlen et al., Chem. Phys. Lett. No. 60, p 364 (1979); and piezoelectric valves, as described in Cross & Valentini, High repetition rate pulsed nozzle beam source, Rev. Sci. Instrum., Vol. 53, No. 1, p 38 (1982), and Bates & Burell, Fast gas injection system for plasma physics experiments, Rev. Sci. Instrum., Vol. 55, No. 6 (1984).

The electromagnetic valves can achieve pulse durations as short as 10 to 100 μsec with pulse repetition rates (PRR) as high as 1–10 Hz. However, these valves generally create considerable RF noise, require complex high voltage power supplies that switch high current levels, and have short lifetimes.

The commercially available automotive fuel injector valves are simpler in use but are slower, with PRR up to 50 Hz. The electromagnetic valves mentioned earlier herein can achieve shorter time durations for a pulse with, however, a poor duty cycle (or PRR). Since approximately a 50% duty cycle is desired in processes according to the invention, pulse width, or duration, is what is sought. Therefore, injector valves based on the commercially available automotive fuel injector valve technology are preferred since they can minimize particulate generation, achieve high PRR with 50% duty cycle and require a low voltage power supply.

Typically, state of the art piezoelectric valves can operate in a pulsed manner with repetition rates greater than 200 Hz and a pulse width of less than 3 msec. Gas pulse rise and fall times of 0.1 and 0.25 msec, respectively, can be obtained. Bates & Burrell, supra, employed a standard Veeco PV-10 piezoelectric valve with a gas tube to produce supersonic jets. In fact, the valve reported by Cross & Valentini, supra, is specified at a PRR of 750 Hz with a pulse width as short as 100 μsec.

Figure 8:
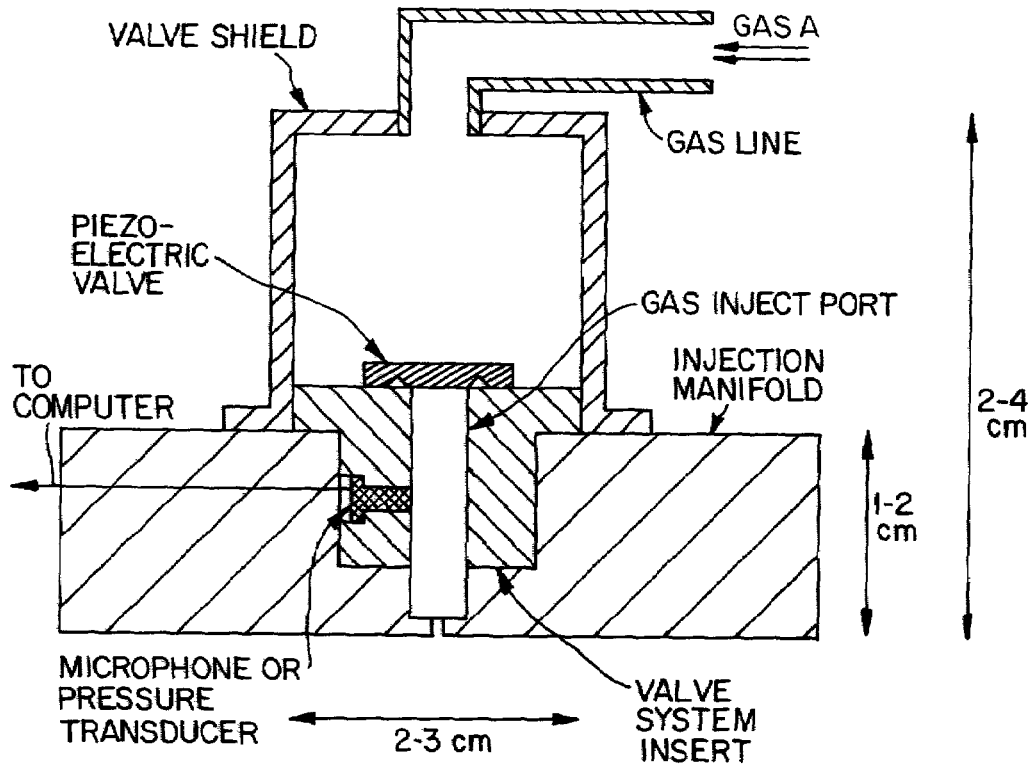
FIGS. 8 and 9 are cross-sectional views of further embodiments of gas injection systems according to the invention.

FIG. 8 illustrates an exemplary injection system with a piezoelectric valve, a gas inlet line, an injection nozzle and a microphone, or a pressure transducer, for pulse monitoring. A processing chamber will be equipped with a plurality of such systems and each system will be fed with a high pressure gas supply line as shown. Between each gas supply and its associated injection system or systems, there will be provided a high response pressure regulator for adjusting source pressure or mass flow, and a mass flow sensor (not shown). These components are external to the processing chamber.

In each injection system, the gas line feeds a small valve plenum enclosed by a gas shield, the plenum being intermittently exposed to the small injection port upon valve actuation. The microphone, pressure regulator and mass flow sensors are all monitored by a computer which in turn controls the pulse rate and mass flow via this feedback. The valve mechanism can be an electromagnetic valve, such as a fuel injector valve, or another one of the valve types referred to above. The gas line within which gas pulses travel before expanding into the low pressure chamber should have a short length to minimize residence time and a small diameter to insure laminar flow. A typical residence time for a gas pulse in this line is 0.08 msec for a 2 cm line, which is determined by integrating the inverse of the local gas velocity along the length of the line. More generally, the line may have a length of 0.5 to 2 cm, with an orifice diameter of 0.5 to 1 mm.

Typically, a plasma processing chamber will be provided with an injection plate associated with several such valve assemblies that must be arranged to permit suitable distribution of two or more gasses that are to be introduced in alternation. For the alternation of two gases using two independent valves, the respective valves will be opened and closed 180 degrees out of phase with one another.

Figure 9:
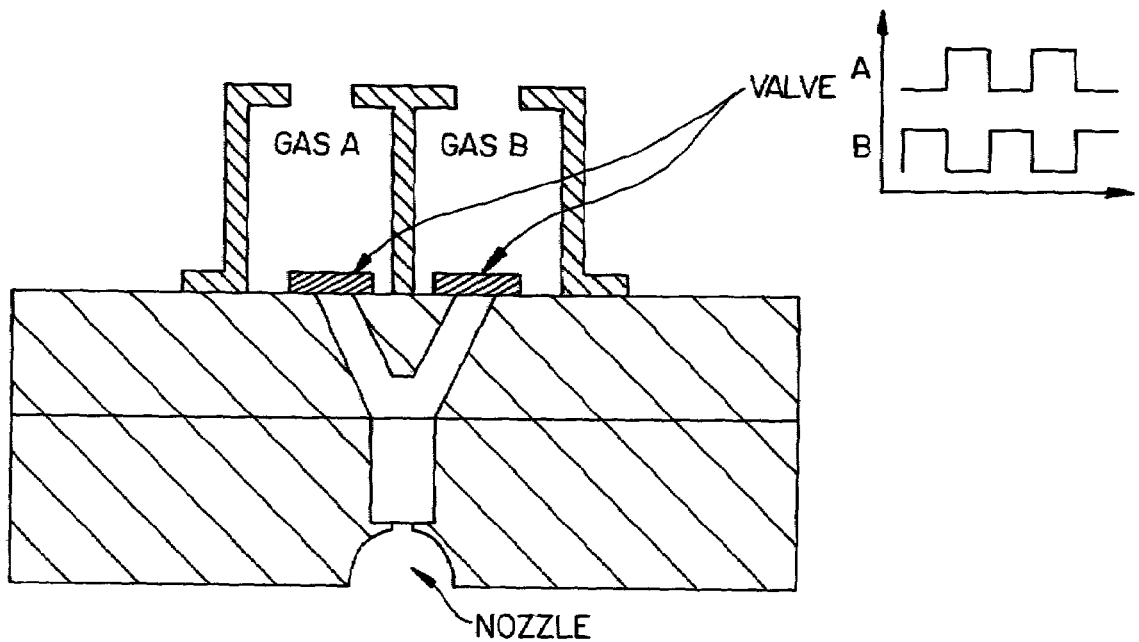

Additionally, two gas valves can be coupled to a single gas inject port, as shown in FIG. 9 where a separate valve and valve plenum are provided for each gas A and B. FIG. 9 further shows the waveforms of the opening and closing control signals supplied to the valves for controlling flow of the two gasses A and B.

A second alternative to gas injection is to access the injection plate from its periphery. In this case, the gas pulse valves would be located at various circumferential positions around the plate, and gas would be distributed to the interior of the plate via machined channels. This approach might only be applicable if there is some impediment to accessing the top of the injection plate. The problem with this arrangement is that the time from gas pulse initiation to injection exit becomes long and, accordingly, the gas residence time from the inlet to the outlet of the injection line becomes of the same order as, or greater than, the pulse time. In order to have some control over the timing of pulses entering the low pressure chamber, pulses of the two gases are introduced in time alternation to the same injection line to produce a "train" of gas pulses. At worst, the pulses of the two different gasses A and B will be consecutive with some time lag between pulse initiation and chamber entrance. One advantage is that such a gas train could mimic a continuous gas flow, especially if the gas properties, i.e., gas constant, ratio of specific heats, etc. are similar.

But even with this approach, the length of the injection line is crucial to the coherence of each gas pulse. In other words, the longer the travel distance, the greater the diffusion between gas species in adjacent pulses. If two gas pulses are introduced in succession into the injection line so that the two pulses are initially contiguous with one another, gasses contained in the two pulses will gradually diffuse into one another. The distance in the direction of gas flow over which gasses from the two pulses have diffused into one another is known as the gas pulse diffusion length. In addition to diffusion, the spatial length of each gas pulse increases progressively due to the accelerating flow experienced within the injection line until emergence from the injection line. As already defined earlier, these injection flows are not turbulent and hence transport relies solely on molecular diffusion. However, the coefficient of molecular diffusivity can be significant, in particular near the entrance to the chamber, since it is inversely proportional to the pressure. This pressure drops as the gas expands, as depicted in FIG. 6B.

Figure 10:
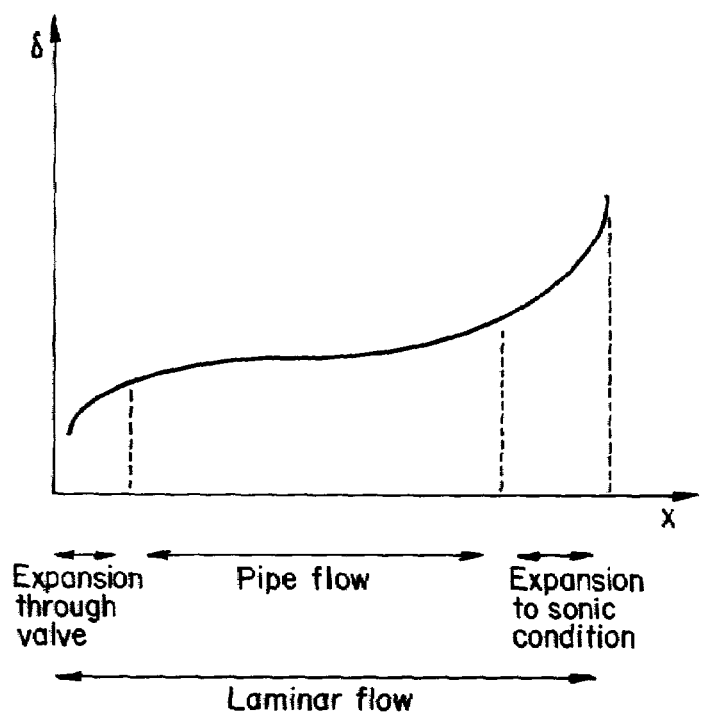
FIGS. 10 and 11 are diagrams illustrating various flow parameters in a plasma processing system according to the invention.
Figure 11:
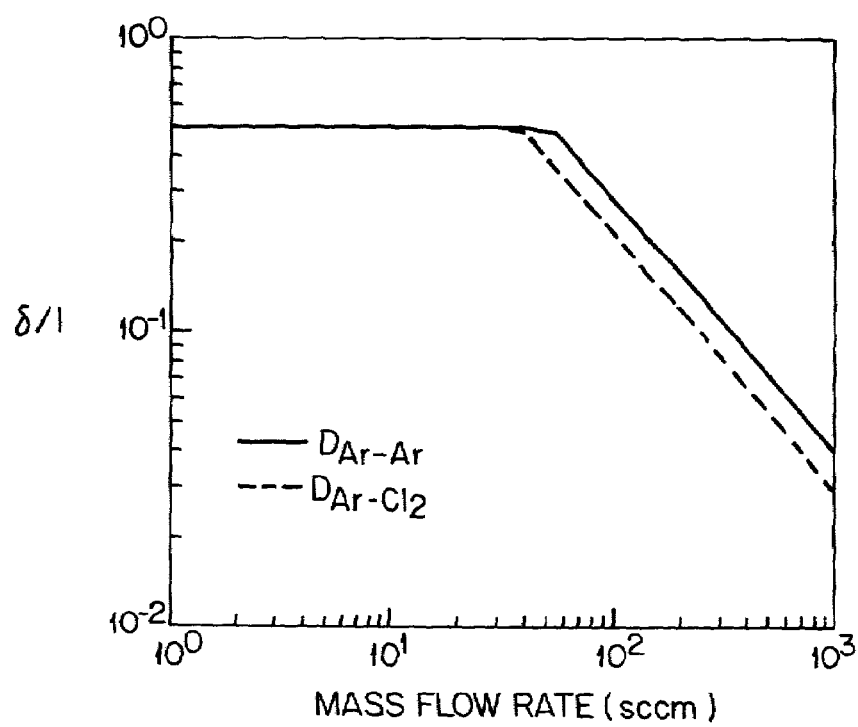

An example of the growth of the gas pulse diffusion length, δ, with respect to distance, x, along the injection line is shown in FIG. 10. Early on δ increases similar to a developing boundary layer. However, it dramatically changes towards the end when the coefficient of molecular diffusivity increases significantly. For larger mass flows or shorter residence times, the relative diffusion length δ/l, where l is the present spatial length of each gas pulse, can be maintained under an acceptable limit such as 5%, as seen in FIG. 11.

In summary, it is feasible under appropriate conditions to use a gas "train" approach, in consonance with work done in the ALE literature, to produce coherent gas pulses with approximately a several msec pulse width.

A third alternative, similar to the second alternative, is to use an Ar gas stream as a carrier gas for the second process gas, e.g., $CF_4$. That is, the Ar gas stream continuously flows to the chamber with intermittent injection of $CF_4$ gas pulses into the Ar gas stream. In this case, Ar gas is always present within the chamber and $CF_4$ is mixed with the Ar in the chamber during spaced time periods.

Figure 12:
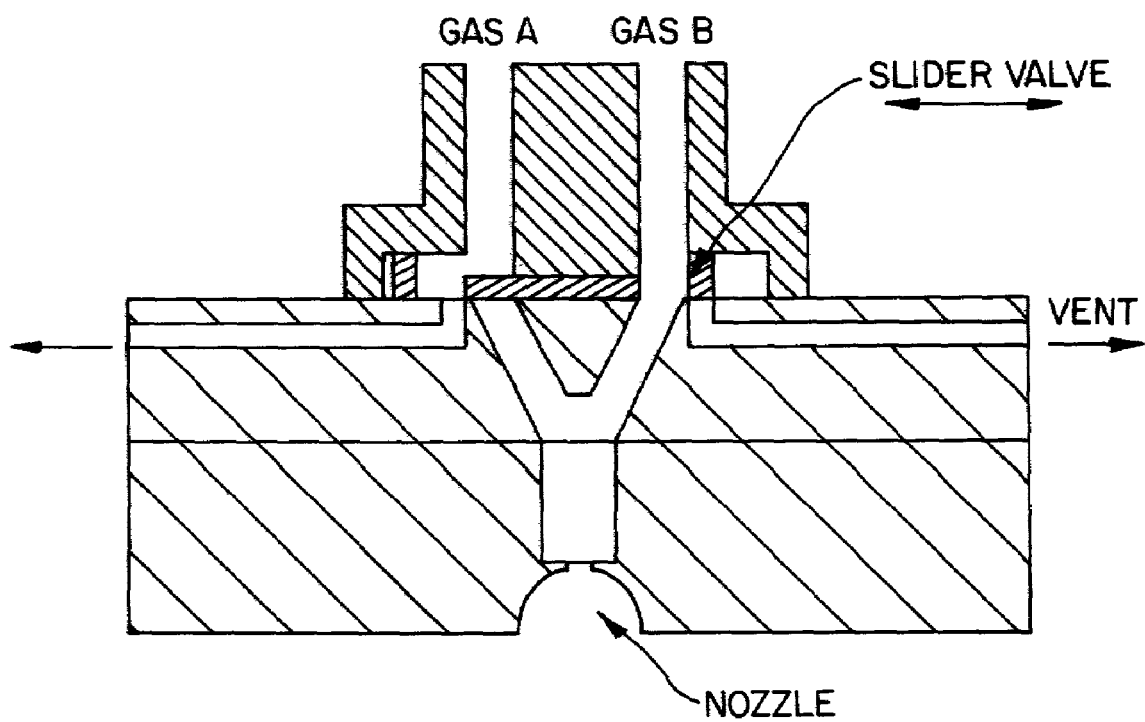
FIG. 12 is a cross-sectional view of a further embodiment of a gas injection system according to the invention.

A fourth alternative for gas injection is shown in FIG. 12. It can be regarded as a run/vent type injection system wherein gas A and gas B are continuously flowing into respective inlet lines and a sliding valve oscillates between two end positions to appropriately re-direct the two gas streams. When the sliding valve is in the far left end position, as shown in FIG. 12, gas A is vented and gas B is injected into the chamber. Conversely, when the sliding valve is in the far right position, gas A is injected into the chamber and gas B is vented.

Figure 13:
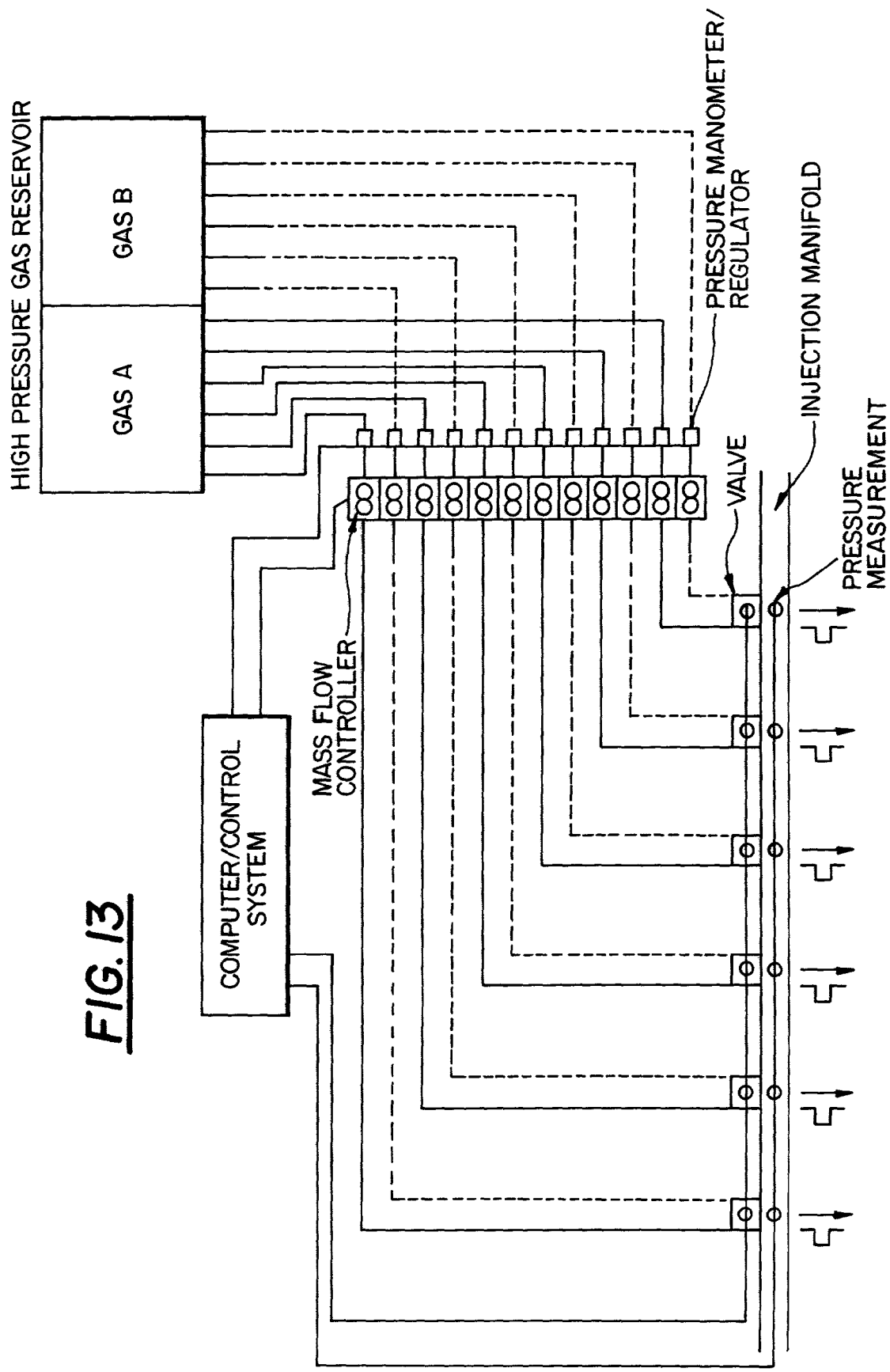
FIG. 13 is a schematic diagram of a gas delivery system according to the invention.

FIG. 13 is a schematic diagram illustrating a system for controlling the delivery of gas pulses to a processing chamber in accordance with one embodiment of the present invention. Two gasses, A and B, are stored under high pressure in respective sections of a gas reservoir and gas is supplied from each reservoir section to a plurality of pressure regulators. Gas supplied to each regulator is conducted through a respective mass flow controller, which typically contains a mass flow sensor, to an associated inlet of a respective gas injection system. In this embodiment, each gas injection system may have the form shown in FIG. 9, supplemented by a pressure transducer as illustrated in FIG. 8. A computer control system is connected to receive mass flow signals from all of the mass flow sensors and pressure signals from all of the gas injection systems. The control system is further connected to control the pressure setting of each of the pressure regulators and to control the opening and closing of the valves in each gas injection system. The control system may be constructed and programmed in accordance with principles already well known in the art to maintain desired gas pressures at the outlets of the regulators and to operate the gas injection system valves with the proper frequency and phase relation. Because the control system receives pressure information from pressure transducers in the gas injection systems, a feedback control of the mass flow rates of the gases and the gas pulse rates can be achieved.

As indicated in FIG. 9, the gas flows may be modulated according to square wave functions. However, as mentioned earlier herein, the gas flows may be modulated according to waveforms representing periodic ramp or sinusoidal functions. A controlled ramp function can be created by varying the flow rate in a series of incremental steps which approximate the ramp function. This can be effected by either stepping a mass flow controller (shown in FIG. 13) in a fashion correlated with the nature of the ramp function or step the opening or closing of the gas injection orifice, which may be an adjustable throat area for supersonic injection. In the former case, the time duration of each step may be in excess of 100 msec. In the latter case, each step can have a duration of less than 100 msec. An additional means to generate a ramp function may be to use a slow response EM or piezoelectric valve wherein the rise time for a given pulse may be of order 1 to 100 msec. This approach has the disadvantage of less control, but can be fairly simple to implement. A similar approach may be taken for a sinusoidal response (i.e. a Sloppy "square" wave).

Several approaches to gas pulse actuation have been presented, but the first solution, involving the use of a plurality of gas injection systems such as those shown in FIGS. 5, 8 and 9, and possibly the fourth solution, such as that shown in FIG. 12, are presently preferred because it is believed that these can be constructed more readily to provide the requisite robust control of the pulse waveform, pulse width, pulse frequency and mass flow.

Gas injection systems according to the present invention can be mounted on a gas injection plate of the type employed in conventional plasma processing apparatus. Such a plate contains cooling channels for cooling the plate in the presence of a RF plasma. Furthermore, although not shown in any of the drawings, the injection system nozzles may be formed in the injection plate and may be actively cooled in a known manner. However, active cooling of the nozzles may not be necessary in light of the cooling that will be produced by gas expansion in each nozzle.

Figure 14A:
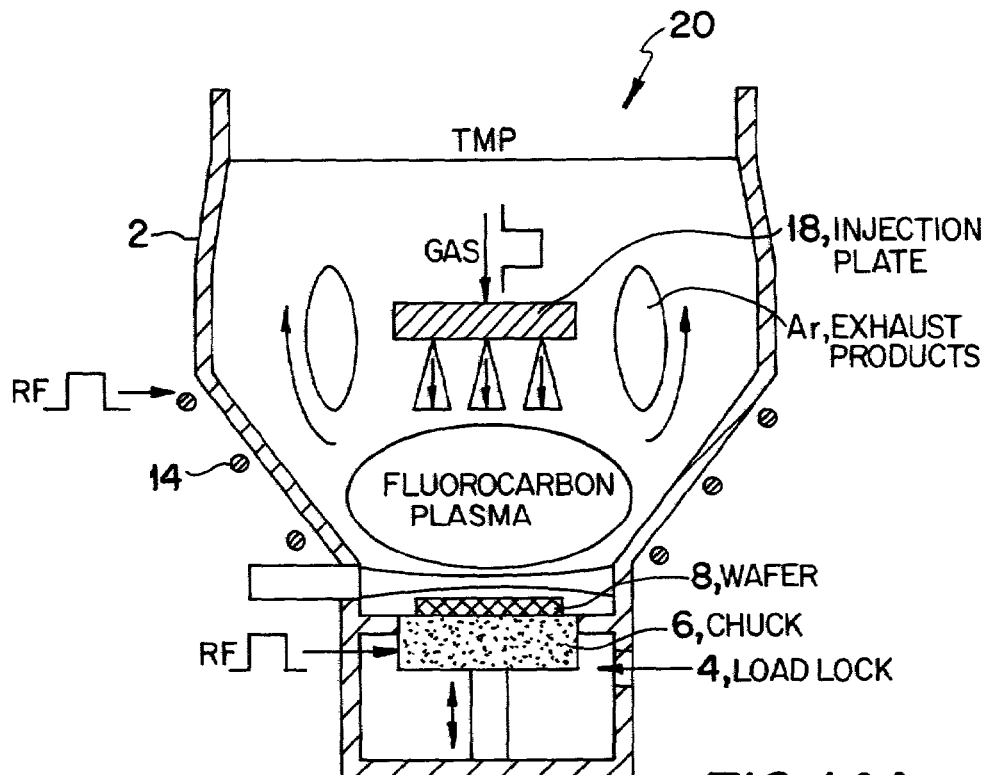
FIGS. 14A and 14B are simplified cross-sectional views illustrating two forms of construction of a plasma reactor for implementing the present invention.
Figure 14B:
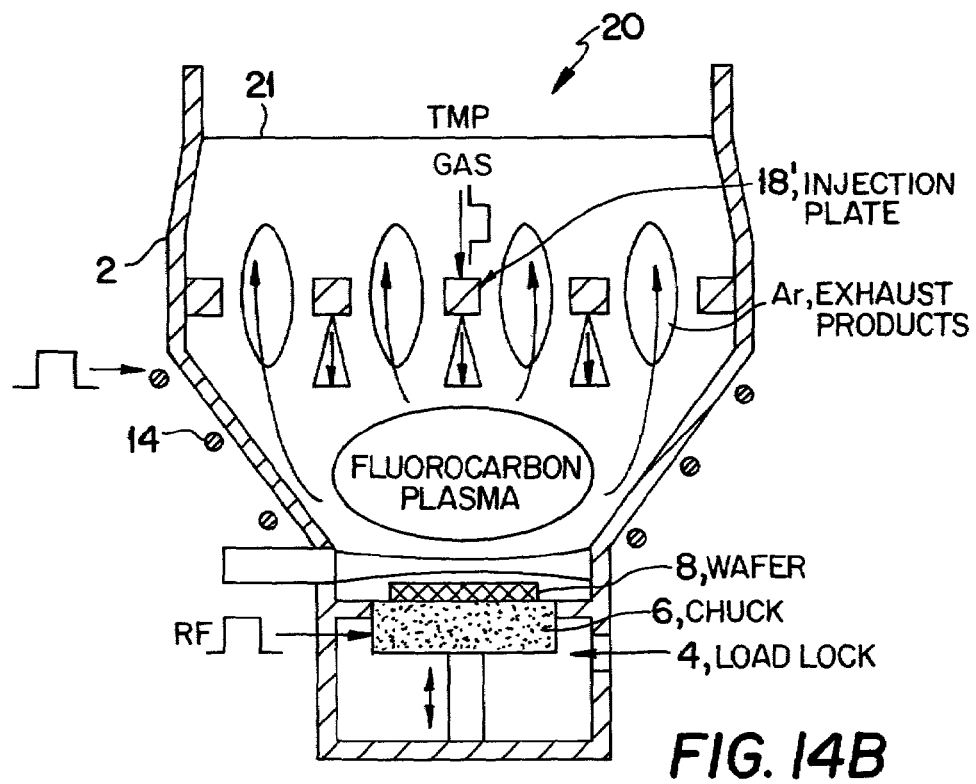

Reactors for carrying out an etching method according to the invention are designated herein as pulsed mode etch (PME) reactors. Embodiments of such reactors will now be described, with emphasis on those characteristics that improve reaction chamber conductance. Two such embodiments thereof are depicted in FIGS. 14A and 14B. These two embodiments differ from one another only in the handling of the gas injection and exhaust. These embodiments may incorporate features disclosed in a copending, commonly owned International Application PCT/US99/07962, filed Apr. 12, 1999, designating the U.S., by Johnson, entitled REDUCED IMPEDANCE CHAMBER, the disclosure of which is incorporated herein by reference.

Each embodiment is composed of a housing 2 enclosing an inverted semi-conical processing chamber having a conical lower end equipped with a load lock 4 housing a vertically movable chuck 6 which supports a substrate. The substrate is typically in the form of a wafer 8 whose upper surface is to be etched. Chuck 6 is mounted for vertical translation in order to allow exchange of wafer 8, and seals the bottom of the plasma region. Housing 2 is surrounded by a multiturn helical coil 14 having a conical form and connected to receive a modulated RF current that will generate an RF field in a conical processing region enclosed by housing 2. Housing 2 is constructed, in accordance with principles known in the art, to electrostatically shield the processing region. Housing 2 further contains a processing gas injection assembly 18, 18' at the top of the processing region and an exhaust pump assembly 20 located above processing gas injection assembly 18. Pump assembly 20 is not shown in detail and may be constituted, in a known manner, by a suitable turbo-molecular pump. Each figure illustrates a moment at the start of a first half-cycle, when $CF_4$ gas is being pumped into the processing region and Ar gas is being pumped out.

In the embodiment shown in FIG. 14A, processing gas injection assembly 18 is composed of a centrally located injection plate. Used gases and etch products are exhausted upwardly through the annular region between the injection plate and the wall of housing 2 to pump assembly 20.

In the embodiment shown in FIG. 14B, the injection plate of assembly 18' extends entirely across the processing region and has inject ports and exhaust ducts which are both distributed uniformly across the upper boundary of the processing region.

In each of these embodiments, the substrate to be processed is placed at the base of the inverted semi-conical chamber. The injection plate is placed at the top of the chamber.

Figure 15A:
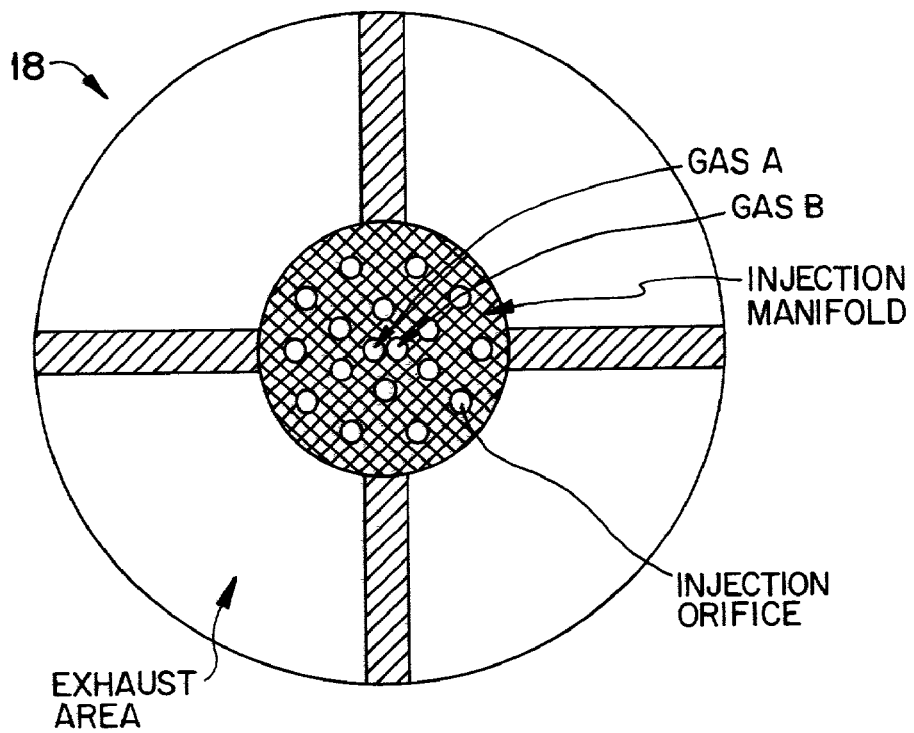
FIG. 15A is a plan view of one embodiment of an injection/exhaust plate forming a component of the reactor shown in FIG. 14A.
Figure 15B:
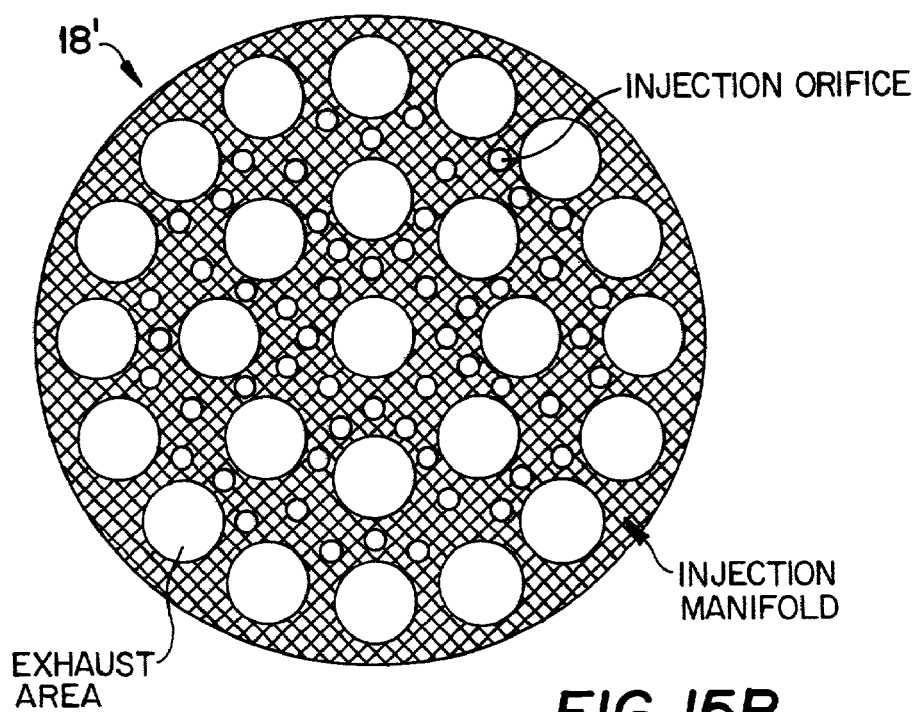
FIG. 15B is a plan view of one embodiment of an injection/exhaust plate forming a component of the reactor of FIG. 14B.

Exemplary embodiments of injection plates, or manifolds, 18 and 18' are shown in FIGS. 15A and 15B, respectively. In FIG. 15A, there are twenty small injection orifices, each approximately 1 mm in diameter at its throat, which is the inlet end of a divergent nozzle as indicated in FIG. 5. The number of orifices that can be provided in plate 18 is not limited to twenty. Plate 18 is further provided with four large pumping quadrants surrounding the inner array of nozzles. The second inject/exhaust plate, shown in FIG. 15B, uniformly distributes the injection ports and exhaust ducts across the top of the plasma source with the intent of minimizing the interaction between injection and exhaust gases, and maximizing the exhaust duct area. These embodiments can be dimensioned for 12 inch wafer processing or any geometrically similar variation.

Figure 16C:
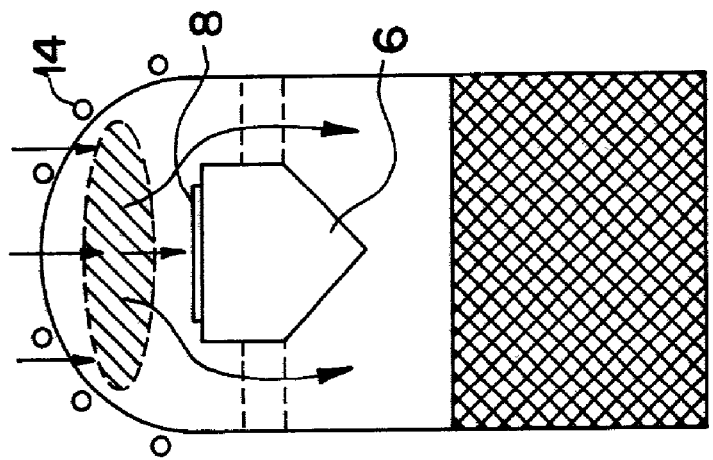
FIGS. 16A, 16B and 16C are simplified cross-sectional views illustrating three further forms of construction of a plasma reactor for implementing the present invention.
Figure 16B:
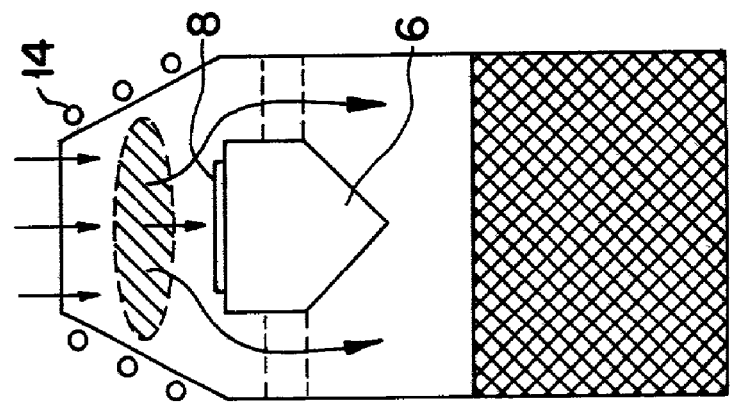
Figure 16A:
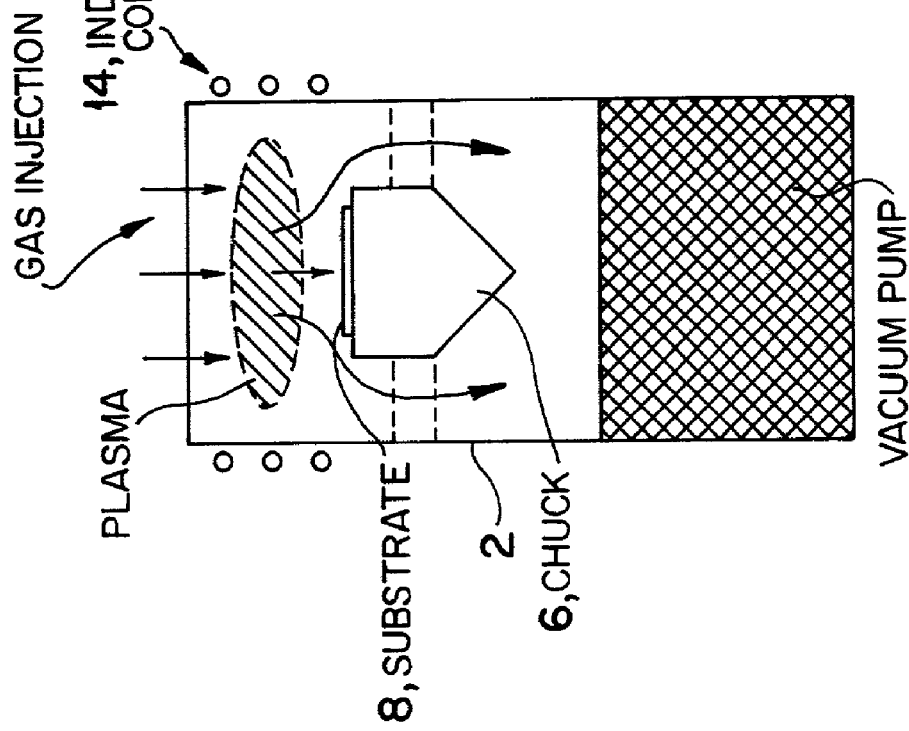

Three further embodiments of reactors for carrying out an etching method according to the invention are shown in FIGS. 16A, 16B and 16C. In all three configurations, the gas injection takes place opposite the substrate and chuck, or substrate holder, and the vacuum pump accesses the processing volume through an annular region surrounding the chuck. In all three embodiments, coil 14 surrounds the top portion of housing 2. Thus, the processing region, or plasma source, is located at, the top portion of housing 2. The only difference between the three configurations is the shape of coil 14, and thus of the processing region. The volume geometries include a cylindrical geometry, as shown in FIG. 16A, a frustoconical geometry, as shown in FIG. 16B, and a hemispherical geometry, as shown in FIG. 16C.

Within the processing chamber of these embodiments, the inclination of the walls performs several functions. At the high Knudsen number limit, it is desirable to have an exit area which is as large as possible relative to the inner surface area in order to improve the conductance of the chamber. The higher the chamber conductance, the greater the chance for exiting atoms and molecules to find their way out. Moreover, when gas is injected into, and pumped out of, the chamber from the top, there is a greater possibility that single bounce atom/molecule travel will occur, as shown in FIG. 2B. In contrast, conventional reactors operating in the free molecular regime require at least two wall collisions for an atom/molecule to exit the chamber. At the low Knudsen number limit, associated with continuum flow, the inclination of the side wall can promote the flow schematically represented in FIG. 2A without flow separation within the corner formed between the bottom and side wall of the chamber. Furthermore, the inclined side wall minimizes the volume of a nominally circularly cylindrical chamber design.

In addition to tuning the gas injection and increasing the chamber conductance, increasing the chamber pumping capacity can additionally improve the gas exchange time. The placement of a 5000 liter/sec pump adjacent to the chamber or the placement of several 1500 liter/sec pumps above the chamber can push the envelope of pump technology. Lastly, as disclosed in copending commonly owned International Application PCT/US99/12827, filed on Jun. 29, 1999, designating the U.S., by Dandl et al, entitled PLASMA VACUUM PUMPING CELL, the disclosure of which is incorporated herein by reference, increased pumping performance can be expected.

In summary, the present invention couples tuned gas injection techniques with state-of-the-art pumping ability in a high conductance chamber in order to maximize the rate at which gases can be exchanged within the reactor.

Figure 17A:
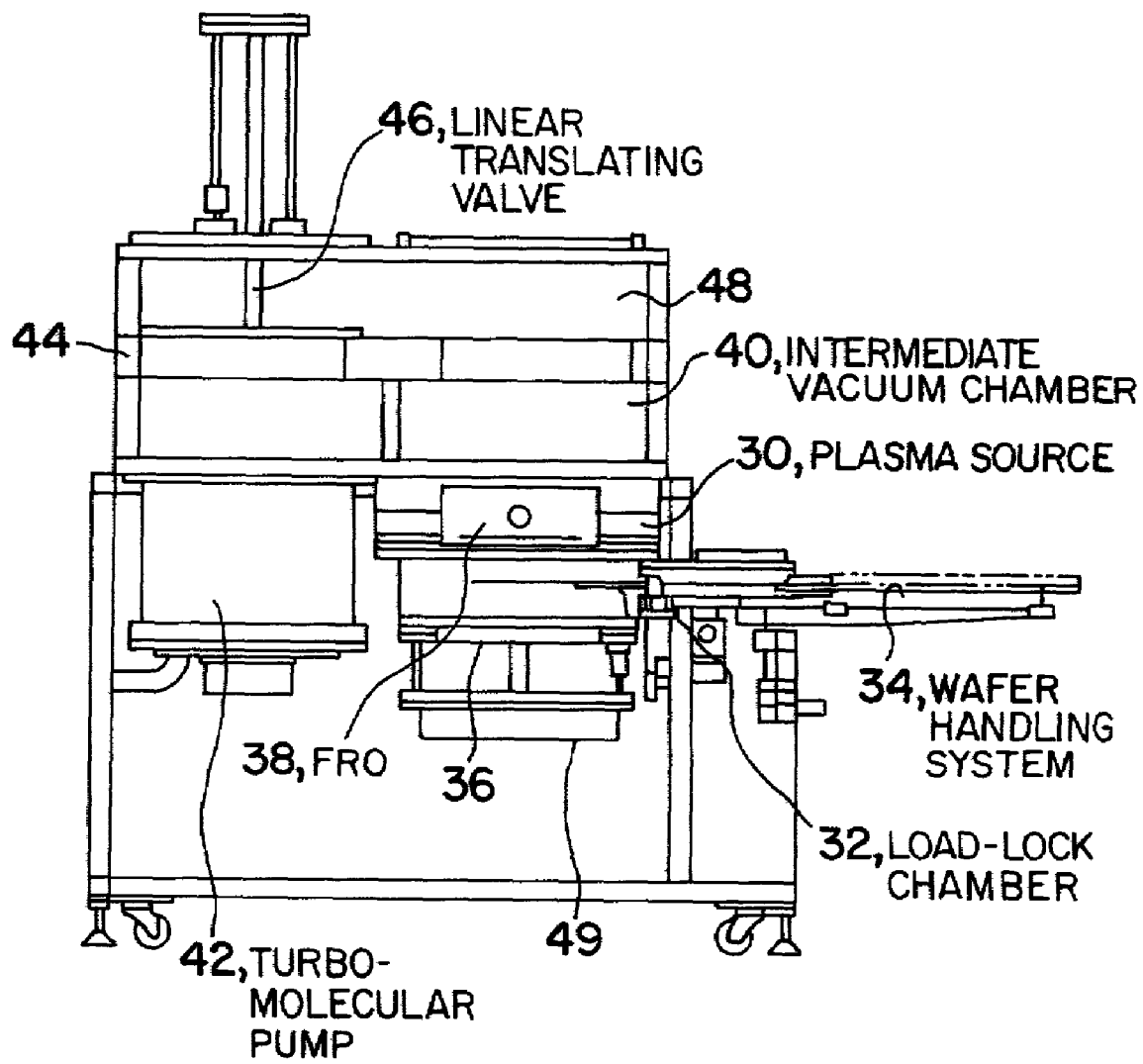
FIGS. 17A, 17B and 17C are, respectively, a side elevational view, a plan view and an end elevational view of a practical embodiment of a reactor apparatus which may be operated according to the present invention.
Figure 17B:
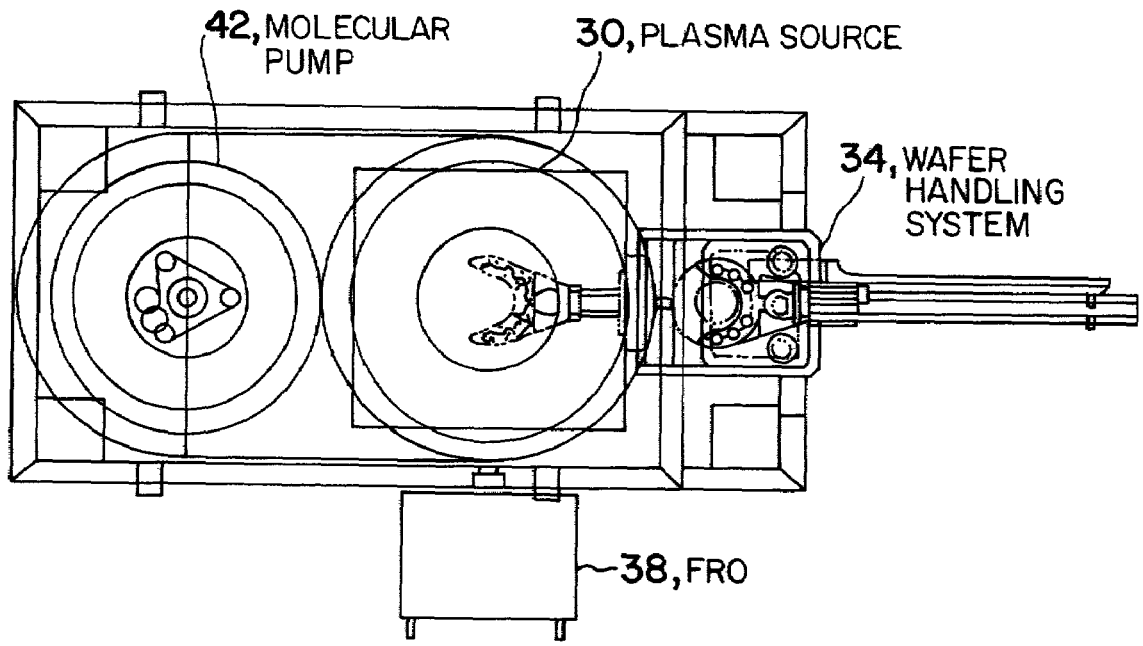
Figure 17C:
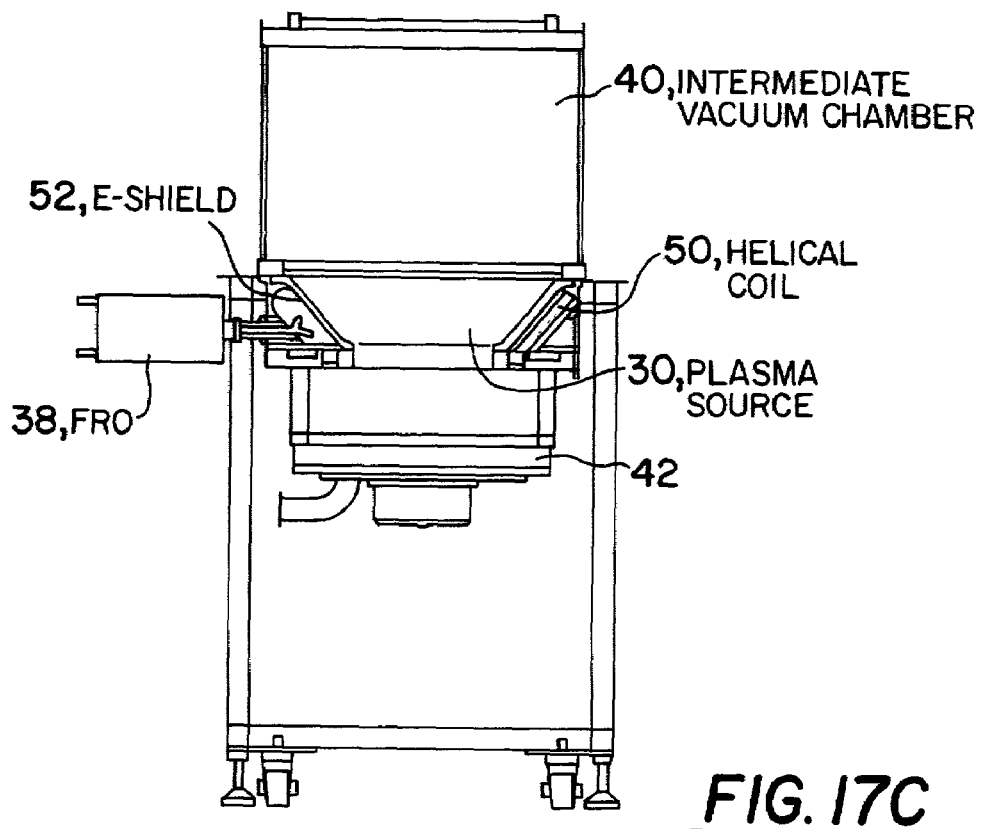

One practical embodiment of a PME reactor according to the invention is illustrated in FIG. 17A, which is a side elevational view, FIG. 17B, which is a top plan view, and FIG. 17C which is an end elevational view. As is apparent from FIGS. 17A and 17C, the components of this embodiment can be carried by a support frame which is mounted on rollers to allow the reactor to be brought to any desired location within a manufacturing facility. All of the individual components of the reactor are either known, per se, can be constructed on the basis of principles that are already well known in the art, or are disclosed herein.

The illustrated PME reactor is composed essentially of a plasma source 30, a load locking chamber 32, a wafer handling system 34, a vertically movable chuck 36 mounted for vertical translation as described above with reference to FIGS. 2A and 2B and to which RF power is to be applied to produce a self-bias, a source power supply 38, which may include a free-running oscillator (FRO) and possibly also an impedance match network and which produces an RF current for the plasma source coil, an intermediate vacuum chamber 40 above source 30, a turbo-molecular pump 42, a plate 44 above source 30 and pump 42, a linear translating valve 46 and an exhaust gas flow region 48 above plate 44. Valve 46 is movable over a range of positions, between a fully closed position in which valve 46 blocks the opening in plate 44 above pump 42 and a fully open position in which valve 46 is in a position which is at a maximum distance form that opening in plate 44. Thus, valve 46 is operable to control the rate of gas flow through an exhaust gas flow path formed by the openings in plate 44 and exhaust gas flow region 48. The reactor further includes suitable processing gas and coolant supply couplings (not shown).

An RF current can be applied to chuck 36 from a separate device 49, which may be an oscillator, such as a FRO, or a match network.

Source 30 includes, in accordance with standard practice in the art, a helical coil 50 connected to receive the RF current produced by oscillator 36, an electrostatic shield 52 and a gas injection assembly (not shown) which may have one of the forms shown in FIGS. 15A and 15B.

Pump 42 may be a commercially available 50001/sec turbo-molecular pump which is mounted adjacent to plasma source 30 and is connected to plasma source 30 via intermediate vacuum chamber 40 and exhaust gas flow region 48. This mounting arrangement is selected because currently available 50001/sec turbo-molecular pumps can not be oriented upside down.

The gas injection assembly associated with source 30 includes both injection orifices and exhaust areas, the latter communicating with pump 42 via intermediate vacuum chamber 40. Thus, both the gas injection assembly and the exhaust orifices separate the processing region enclosed by plasma source 30 from intermediate vacuum chamber 40.

A second embodiment can employ several smaller turbo-molecular pumps above the intermediate vacuum chamber.

A third embodiment can have the form disclosed in copending Provisional U.S. Patent Application No. 60/114,453, filed on Dec. 30, 1998, entitled PLASMA PUMP, the disclosure of which is incorporated herein by reference, and in the previously-cited International Application PCT/US99/12827. This embodiment provides improved pumping efficiency and space usage.

Figure 18:
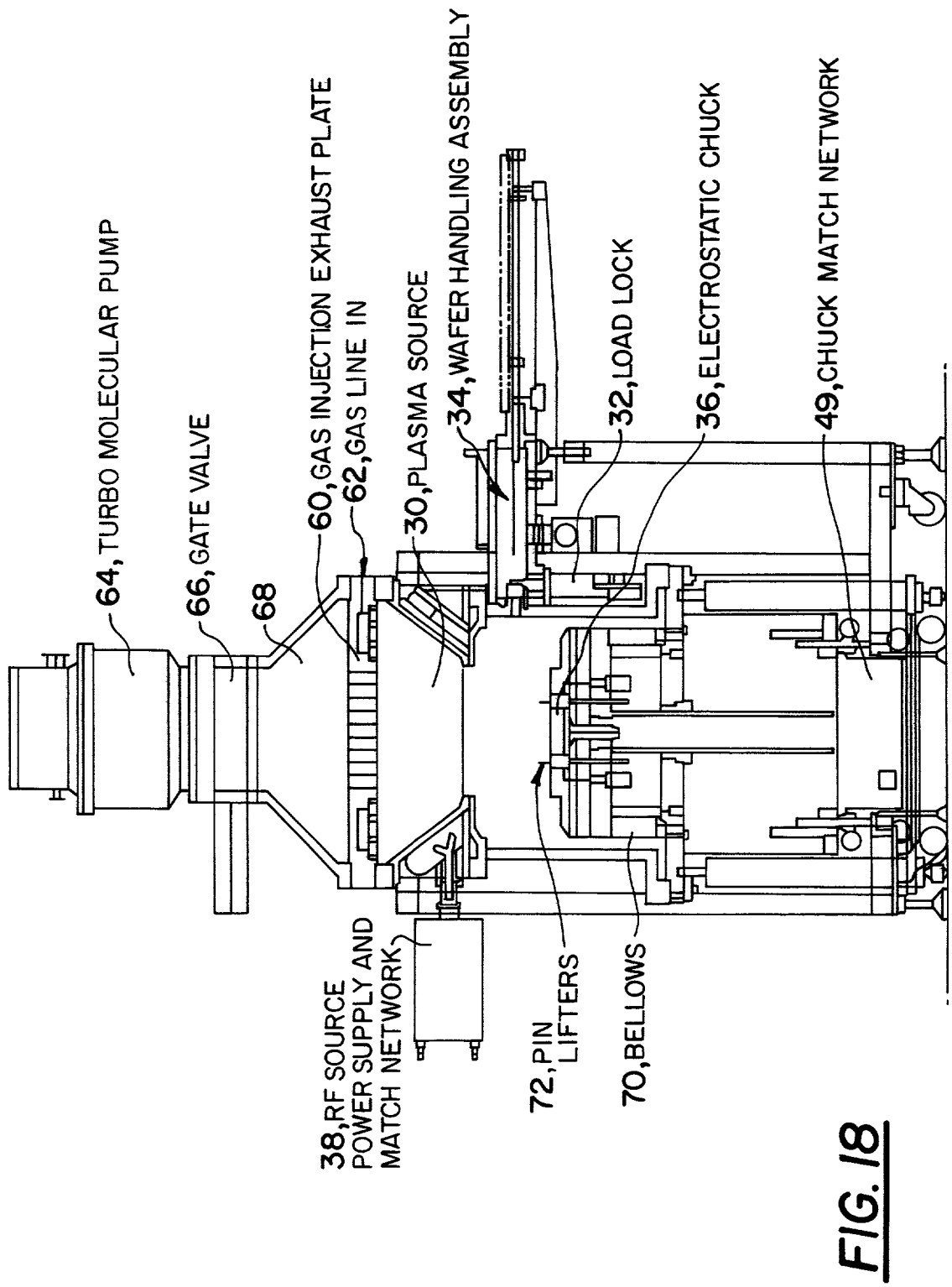
FIG. 18 is a side elevational view, partly in cross section, of a further practical embodiment of a reactor apparatus which may be operated according to the present invention.

FIG. 18 is a view similar to that of FIG. 17A, illustrating a further practical embodiment of a PME reactor according to the invention. Many of the components of the reactor shown in FIG. 18 are identical to those shown in FIGS. 17A, 17B and 17C. Those components are identified by the same reference numerals as employed in FIGS. 17A, 17B and 17C and will not be described again.

As in the case of the embodiment of FIG. 17, the components of the embodiments shown in FIG. 18 are carried by a support frame which is mounted on rollers to allow the reactor to be brought to any desired location within a manufacturing facility.

The top of plasma source 30 is delimited by a gas injection/exhaust plate 60 equipped with gas line inlets 62. The embodiments of FIG. 17 will also be equipped with a gas injection/exhaust plate and gas line inputs, although these are not specifically identified in FIG. 17.

The embodiment shown in FIG. 18 differs from that of FIG. 17 essentially by the disposition of a turbo-molecular pump 64 above, and in vertical alignment with, plasma source 30. Turbo-molecular pump 64 is separated from plate 60 by a gate inlet valve 66 and a transition duct 68.

In a preferred embodiment of the reactor shown in FIG. 18, turbo-molecular pump is a single 3,000 l/sec pump, in place of the 5,000 l/sec pump of FIG. 17.

Also shown in FIG. 18, but not in FIG. 17, are a bellows 70 and pin lifters 72 associated with chuck 36. As is conventional in the art, bellows 70 allows vertical movement of chuck 36 while assuring that the processing region enclosed by plasma source 30 remains sealed. Pin lifters 72, which are also conventional in the art, are operated to lift a wafer from the surface of electrostatic chuck 36 for removal from the processing region via wafer handling assembly 34.

Figure 19A:
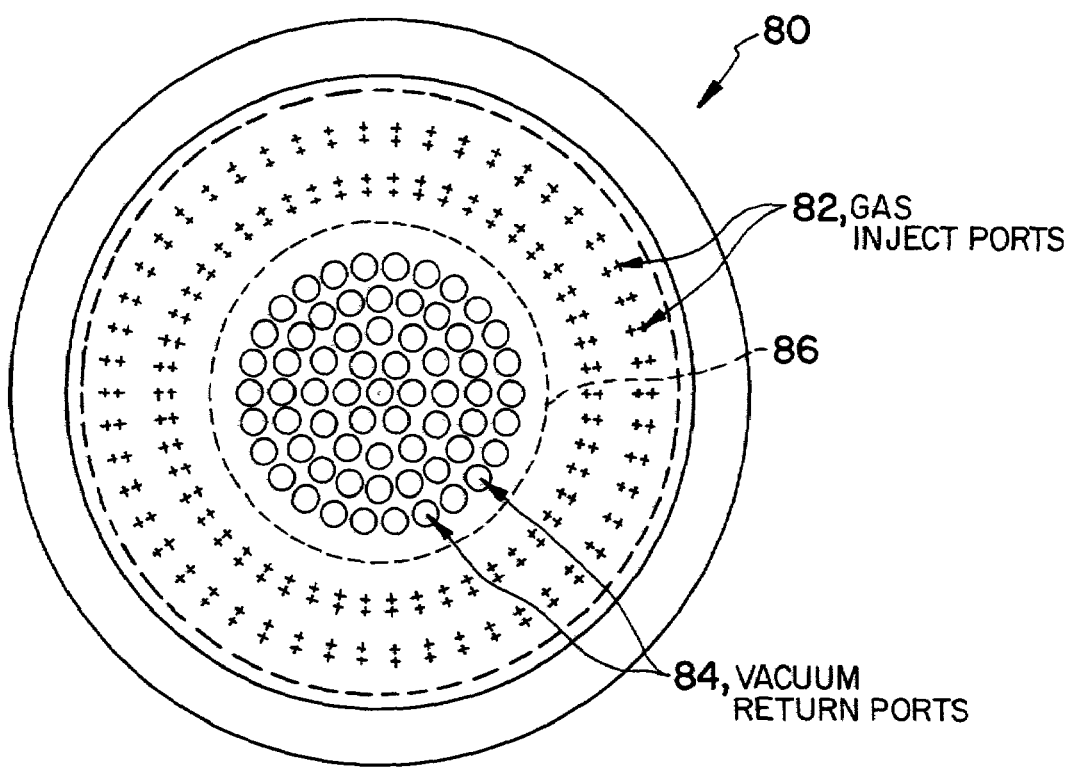
FIGS. 19A, 19B and 19C are plan views of three embodiments of injection/exhaust plates that can each be used as a component of the reactor apparatus of FIG. 18, as well as in the reactor apparatus of FIGS. 14A and 14B.
Figure 19B:
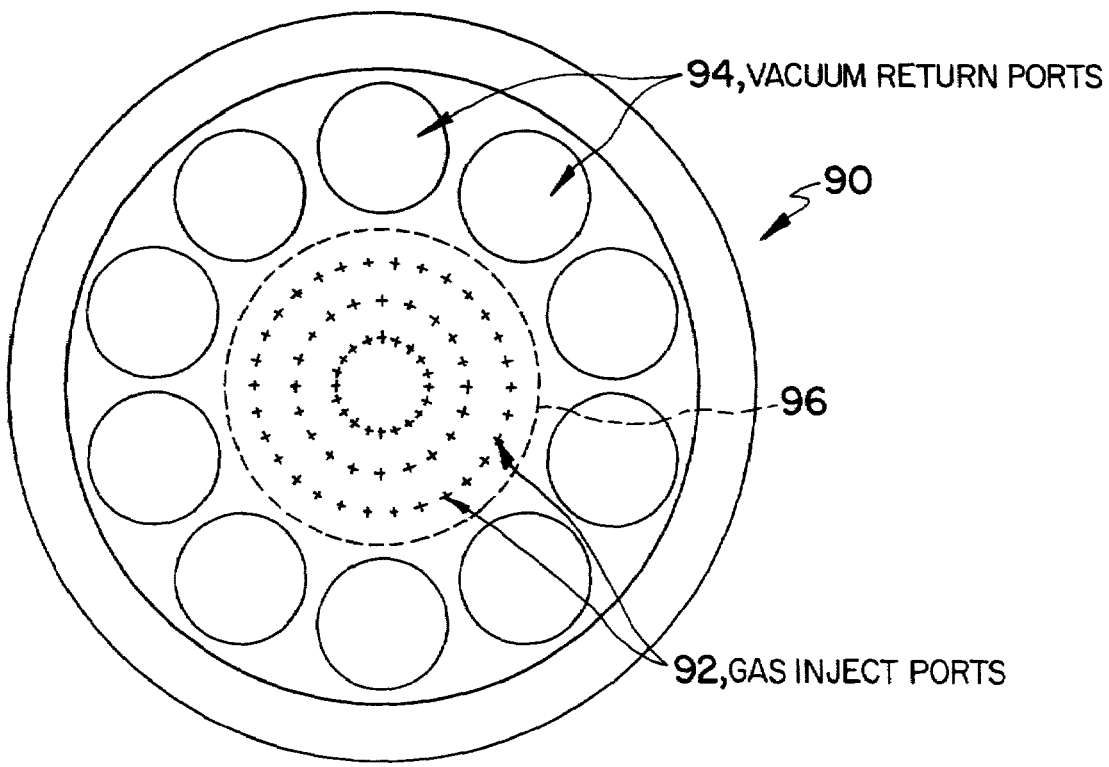
Figure 19C:
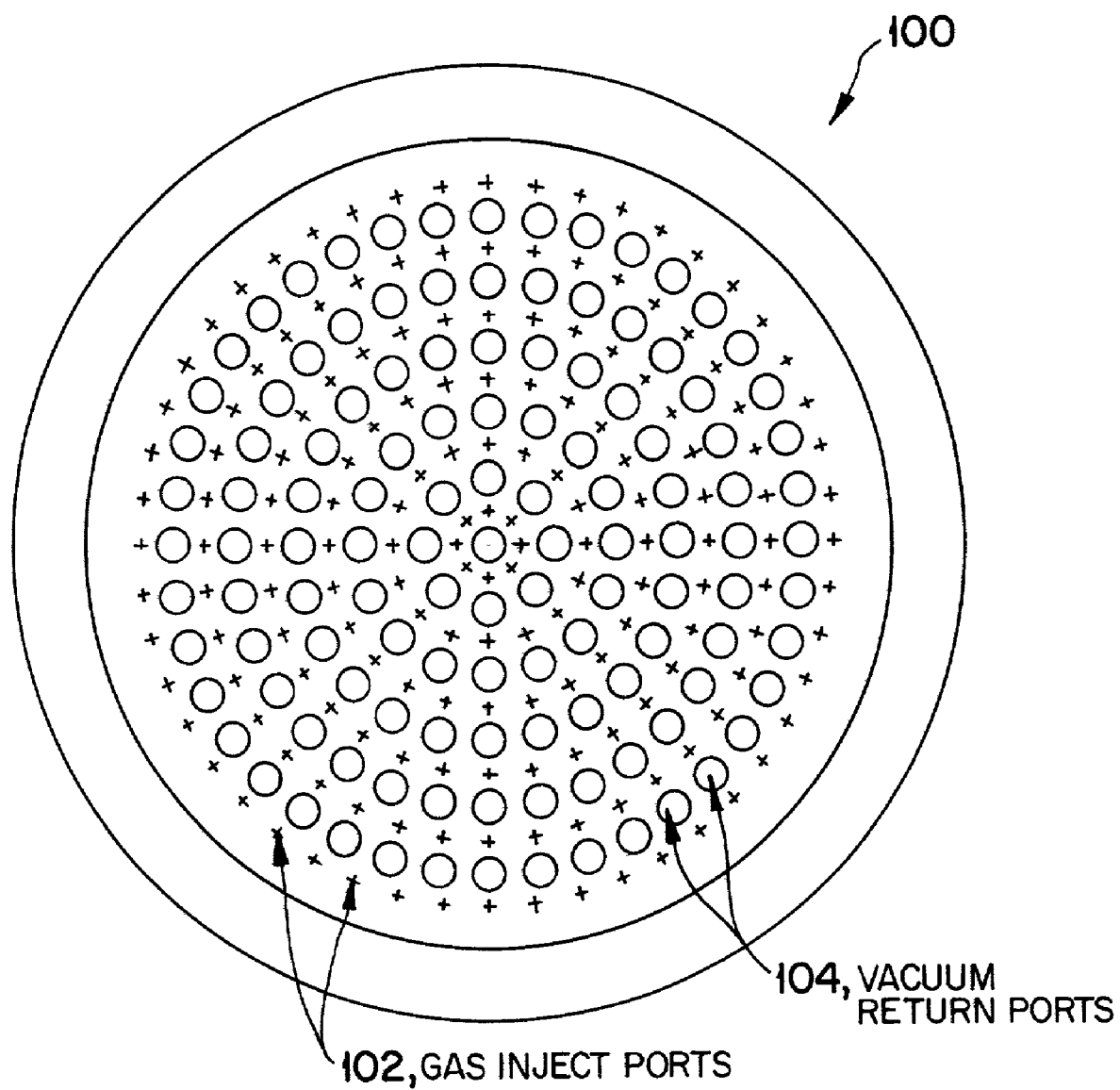

FIGS. 19A, 19B and 19c are plan views illustrating three possible embodiments of injection/exhaust plates that can be utilized in the reactor of FIG. 18, as well as in the reactor of FIG. 17.

In FIG. 19A, plate 80 is provided with several concentric rows of gas injection ports 82 surrounding a central region containing an array of vacuum return ports 84 that will be in communication with pump 64. A boundary 86 separates the region occupied by ports 82 from the region occupied by ports 84.

FIG. 19B illustrates a plate 90 having an array of gas inject ports 92 surrounded by a circular array of vacuum return ports 94. A boundary 96 separates the region occupied by inject ports 92 from the region occupied by return ports 94. In this embodiment, the return ports, which communicate with pump 64, each has a relatively large diameter.

FIG. 19C illustrates an embodiment of a plate 100 in which gas inject ports 102 are essentially interspersed with vacuum return ports 104. Gas inject ports 102 are arranged to form a plurality of circular, concentric rings, as are vacuum return ports 104, with the rings of gas inject ports 102 alternating with the rings of vacuum return ports 104. Other patterns of these ports are, of course, contemplated.

As described earlier herein, the amplitude of the RF power delivered to the plasma source will be modulated to produce plasma conditions favorable for the particular process. For instance, according to the invention, the RF source power may be modulated between a "low" power level and a "high" power level in synchronism with the exchange of, for example, $CF_4$ and Ar gas in the chamber. However, there may be a phase shift which is small in comparison to $\pi$ radians between the power level modulation and the gas exchange.

The temporal modulation of RF power on this time scale is primarily limited by the ability to match the time varying load impedance of the plasma source and, hence, maintain 100% power transfer. Conventional RF match networks using mechanical devices to adjust capacitors can only attain controlled pulse widths of 2–5 seconds assuming 100 steps to define an RF power pulse within 1% accuracy (response time of fastest match networks reach 250 to 500 msec). As was previously discussed herein in connection with gas exchange rates, the modulation of the RF source power is intended to operate with a pulse width comparable with the gas residence time (or gas exchange time). This requires the capability of pulsing the RF source power on a time scale of 1–10 msec, which certainly exceeds the ability of current match networks.

According to the present invention, the desired power modulation rates may be attained by using a free running oscillator (FRO), as disclosed in copending Provisional U.S. Patent Application No. 60/143548, filed on Jul. 13, 1999, entitled "Radio Frequency Power Source for Generating an Inductively Coupled Plasma", the disclosure of which is incorporated herein by reference. This RF power supply incorporates a free running oscillator which automatically adjusts the input RF frequency in response to variations of the load resonant frequency. The use of a FRO eliminates the need for a match network and solid state RF power supply, and replaces them with an RF section local to the plasma source and a remotely located DC power supply. As plasma conditions change in the ESRF source due to variations in RF power, pressure, temperature, mass flow and/or gas species, the RF frequency (or oscillator frequency) adjusts accordingly in response to variations in the natural frequency of the plasma source. There exist several advantages to the proposed solution including reliability, repeatability, speed, pulse capability and the use of frequency monitoring as a diagnostic of the plasma condition.

The response of the FRO to plasma source variations is limited to the time for the gas/plasma to stabilize within the reactor due to input variations. This may be tens of microseconds during run conditions and as high as 1 msec during start conditions. The fact that the FRO requires no mechanical tuning during both run and start conditions implies no additional lags in the response of the input RF power supply. Hence, the FRO demonstrates the ability to pulse RF power between zero and a finite power level, and between different levels of power with rise and fall times of 30 and 50 μsec, respectively. Unlike the solid state power supply with a match network, capable of producing pulses with a duration, or width, of 2 to 5 seconds, the FRO can produce RF power pulses with a temporal pulse width of 3 to 5 msec. In addition, the ability of the FRO to pulse between different levels of power allows for variation of the RF power using a complex multi-level, cyclical or non-cyclical dependence with time.

The FRO system includes a high voltage DC power supply and an oscillator having an electron tube containing a variable potential grid to control electron flow through the electron tube. All of these components are inductively coupled to a plasma source chamber via a helical coil. Electronic noise in the circuit generates the initial perturbation and a preferred wavelength is amplified. The persistence of the resulting oscillation depends on whether the gain of the feedback voltage is greater than unity. As conditions in the plasma vary, so does the potential across the electron tube due to the feedback and, subsequently, the electron tube self-adjusts the oscillation frequency.

There exist two alternatives described in the last-mentioned pending Provisional U.S. patent application. One method of achieving pulsed operation is to pulse the electron grid potential. With this method, pulse rise and fall times of 30 and 50 μsec, respectively, have been attained. A second method pulses the B+ power supply. Although this pulsing is at higher power, it allows the pulse rise and fall times to be shorter and repetition rates to be higher.

Thus an FRO is presently the preferred system for delivering pulsed RF power to the plasma source, as well as to the chuck, as will be described below. It enables pulsed processing at high rates in excess of 500 Hz and provides a robust system for control of the RF power level or plasma density. Plasma density control requires measurement of the plasma density and feedback of the measured plasma density value.

Another approach, which appears to be more expensive, requires using a frequency agile RF power generator in conjunction with a phase/magnitude detector for feedback control of the frequency. In this manner, the RF power can be modulated, while maximum power transfer is maintained due to varying the RF frequency. A generator of this type is disclosed in U.S. Pat. No. 5,688,357, which issued to Hanawa on Nov. 18, 1997. However, for systems according to the present invention, it may be modified to include a pulse modulated RF amplifier inserted in place of the already existing amplifier.

Having thus described methods for driving the plasma source with pulse modulated RF power, a method for controlling the exchange of gaseous species will now be described. An etching procedure using $CF_4$ and Ar as the gas species was previously described. The two gas species to be exchanged will here be identified more generally as A and B. It should be understood, however, that for certain procedures there can be more than two gas species and corresponding RF cycles, as will be discussed in greater detail below.

Figure 20A:
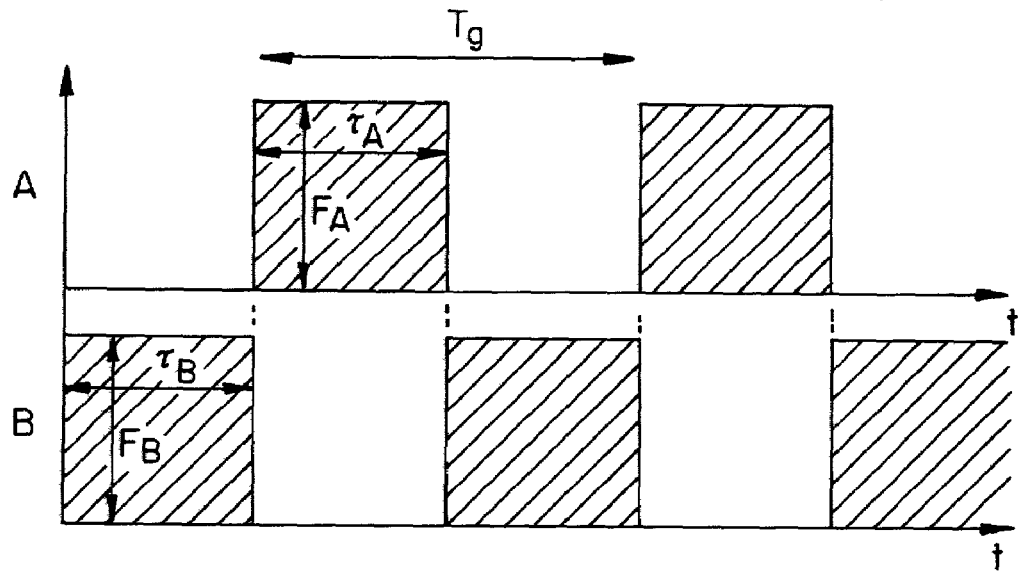
FIGS. 20A, 20B, 20C and 20D are waveform diagrams illustrating modulation of various parameters in a process according to the present invention.
Figure 20B:
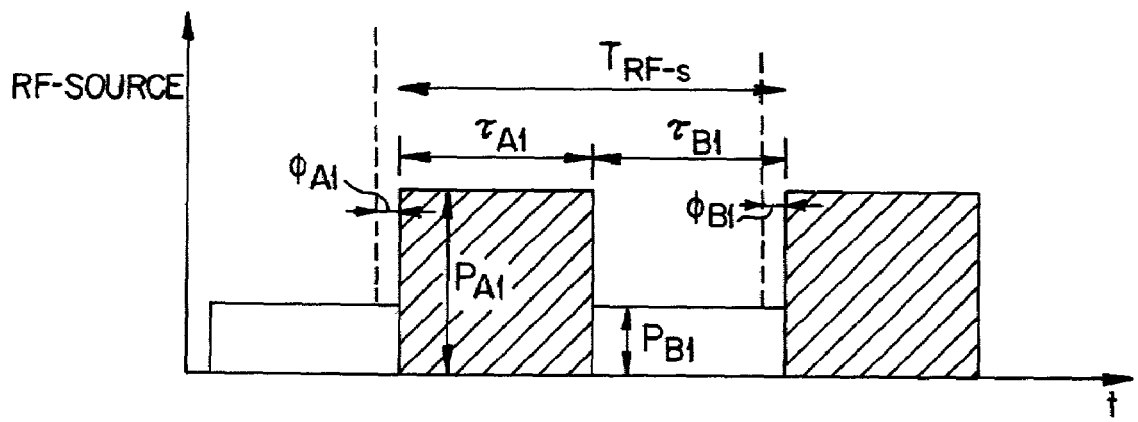
Figure 20C:
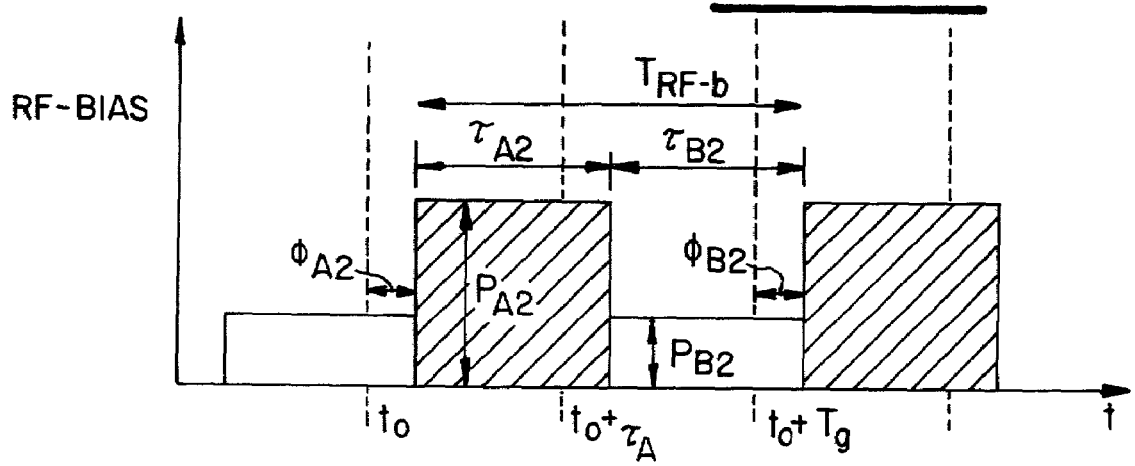

FIGS. 20A, 20B and 20C are diagrams showing an example of the amplitude and relative phasing of three temporally modulated process components, i.e., the gas species in FIG. 20A, the RF source power in FIG. 20B and the RF bias power applied to the chuck in FIG. 20C. It is assumed that the gas exchange pulse period $T_g$ is at least approximately equal to the respective RF source and chuck bias power periods, $T_{RF-S}$ and $T_{RF-b}$. However, in general, this need not always be true.

In FIG. 20A, the gas exchange cycle is defined by its period, $T_g$, the respective pulse widths of the half cycles of the two gasses are $\tau_A$ and $\tau_B$, and the respective mass flow rates of the two gasses are $F_A$ and $F_B$.

Similarly, in FIG. 20B, the RF source power cycle is defined by its period, $T_{RF-s}$, the respective amplitudes of the two half-cycle of each RF source power cycle are $P_{A1}$ and $P_{B1}$, the respective pulse widths of the half cycles of each RF source power cycle are $\tau_{A1}$ and $\tau_{B1}$ and the respective phases of the RF source power half cycles are $\phi_{A1}$ and $\phi_{B1}$, relative to the respective gas species half cycles.

FIG. 20C shows comparable parameters for the RF bias power applied to the chuck, these being the RF bias power cycle period, $T_{RF-b}$, the respective amplitudes $P_{A2}$ and $P_{B2}$ of the two half-cycle of each RF bias power cycle, the respective pulse widths $\tau_{A2}$ and $\tau_{B2}$ of the half cycles of each RF bias power cycle and the respective phases $\phi_{A2}$ and $\phi_{B2}$, of the RF source power half cycles relative to the respective gas species half cycles.

Figure 20D:
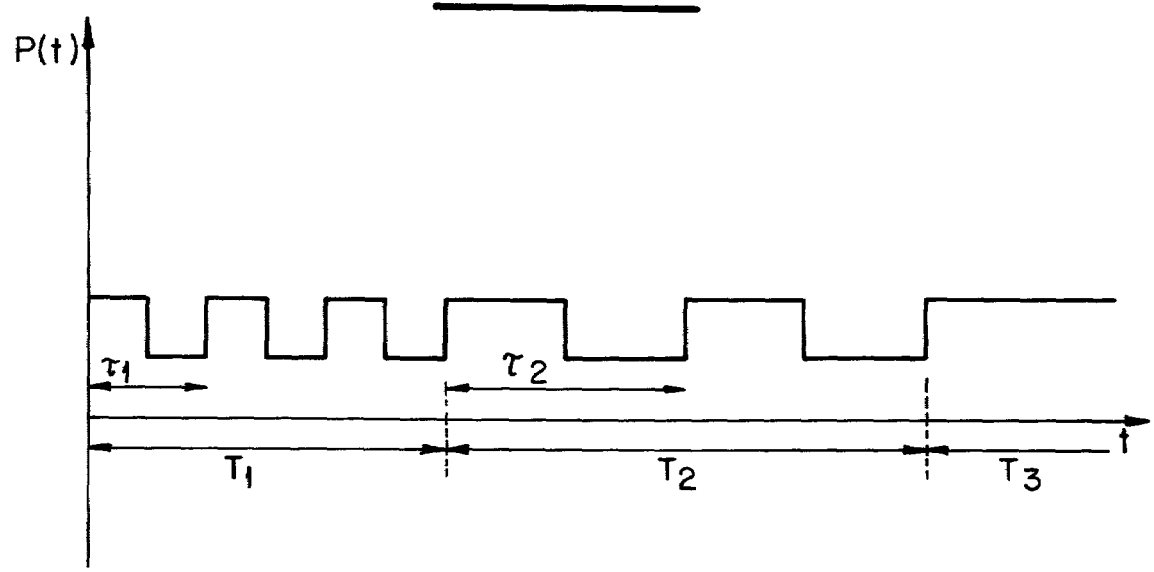
Figure 21:
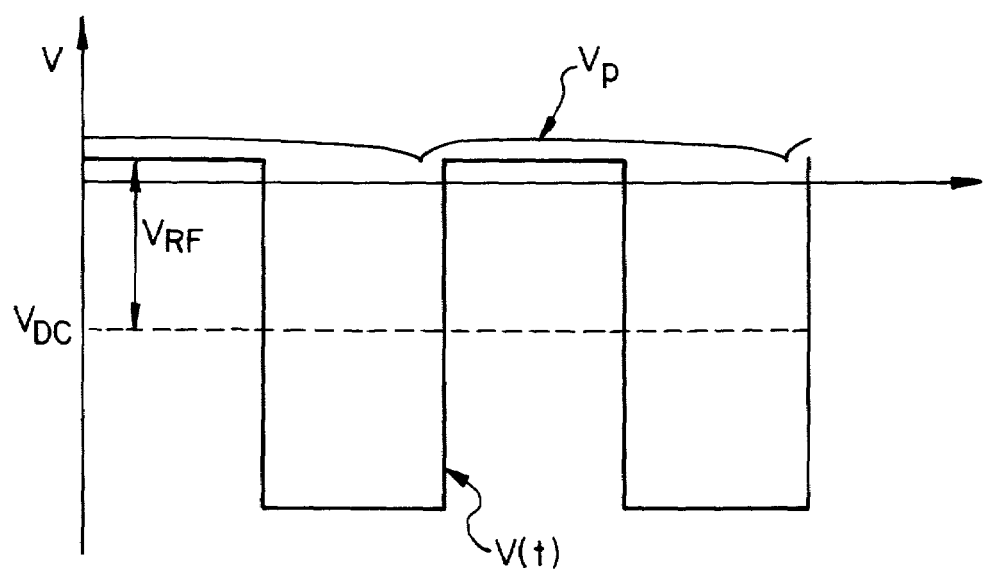
FIG. 21 is a signal diagram illustrating the creation of a self-bias on the wafer chuck of a plasma reactor operating according to the present invention.

In further accordance with the invention, modulation of source power, bias power and/or gas flow can have a varying periodicity dependent on changes in chamber conditions and/or process requirements. FIG. 20D shows one example of such a modulation pattern composed of a first time interval $T_1$ during which pulses having a repetition period $\tau_1$ are provided, a second time interval $T_2$ during which pulses having a repetition period $\tau_2$ are provided and a third time interval $T_3$ during which there is no modulation. Such a pattern may be advantageous for many applications in which an etch or deposition process is composed of several steps. Each step may be associated with a respective one of the time intervals $T_1$, $T_2$, $T_3$, etc. Each step may be associated with a different chamber condition, a demand for a different etch rate, such as a possible reduction in the etch rate prior to the process endpoint, a different selectivity of the etch process, etc.

Due to the complexity, and particularly the number of independent variables, of the system described above, it may be useful to employ a neural network wherein a centralized computer may receive either in-situ diagnostics from the electrical system and/or pre-stored process data, including desired etch rate, selectivity, feature profile parameters, etc., from a database and adjust the large parameter space to achieve optimal process results. The use of neural networks for multi-variate statistical analysis is well documented in the literature.

In the descriptions provided thus far, it has been assumed that the minimum pulse width is limited to the minimum gas exchange time. This might be 1 to 10 msec. The pulsing of the gas and the RF power are not, however, limited to this time scale. They may be modulated at 1 msec, for example. It may occur that the gas can not be completely exchanged in this time period and therefore there is a lag time which can be accommodated by phasing the RF power application relative to the gas pulsing. This is just one example. The phase shift enables adjusting the process to optimal conditions in light of non-optimal situations at extremely high pulse rates.

There can be more than two gas components and process components. Hence, these components may be represented by $P_{ij}$ and $\phi_{ij}$, etc., where the indices "i" and "j" represent the gas component and process component, respectively. Each parameter may nominally be set on the basis of experience, and can be modified on the basis of observation of the process result. For instance, plasma density monitoring, to be discussed below, or in situ emission spectroscopy can be employed to provide real-time control via feedback to system components for adjusting these parameters.

The modulation of gas species and RF source power is coupled with modulation of the RF bias power applied to the chuck to control the ion energy distribution and spectral distribution. The ion energy is directly related to the DC self-bias present on the substrate and providing a driving potential for accelerating positive ions across the plasma sheath and into the substrate.

When RF power is applied to a chuck holding a substrate via a coupling capacitor, a DC self-bias originates as a result of differences in the mobility of electrons and positive ions across the plasma sheath. The mechanism of, and techniques for, generating a DC self-bias are already well-known in the prior art.

The modulation of the RF bias power delivered to the chuck will consist of the following: (i) modulation of the amplitude of the RF power, (ii) modulation of the phase between pulsed components, and (iii) modulation of the harmonic content within the RF signal. The significance of each is addressed below.

The temporal modulation of the amplitude and the phase of the RF bias power delivered to the chuck relative to the exchange of gas in the chamber is realized in a fashion similar to that described above with respect to temporal modulation of the amplitude and the phase of the RF source power. As with the RF source power, a free running oscillator (FRO) can be employed to supply RF power to the chuck.

In connection with modulation of the harmonic content and amplitude of a RF biased chuck, consideration must be given to the matter of controlling a plasma sheath. In oxide etching, it is believed that, in general, the currently available plasma reactors present a circuit impedance between the wafer RF drive and ground which exceeds the impedance of the plasma sheath by more than an order of magnitude. Such high impedance levels prevent the achievement of effective plasma sheath control. A plasma reactor structure having a sufficiently low impedance is disclosed in copending International Application PCT/US99/07962, cited earlier herein.

Typically within plasma reactors, the impedance between the ground electrode in the reactor and the driven electrode (i.e., the chuck) can be attributed to several components. The reactor geometry requires the electrical path from chuck to ground to pass through the bellows that surrounds the chuck and its support, through spokes that extend from the chuck to the chamber wall, up the outer wall, through the plasma source and to the injection plate. This is disclosed in further detail in International Application PCT/US99/07962, cited earlier herein. The reactor geometry shown in FIGS. 14A and 14B eliminates several components of the above electrical path, i.e., the chamber walls, the bellows and the spokes of the chamber bottom. The chuck is positioned immediately adjacent to the plasma source bottom and the chuck in fact serves as the bottom wall of the reactor. The chuck is designed to move up and down such that it can move vertically downwardly into the load-lock chamber to receive or deliver a wafer and then move vertically upwardly and lock into its run position, where it serves as the plasma source base. Due to the reduction in chamber impedance by the elimination of several reactances, control of the plasma sheath becomes more feasible to practice.

A method of pulsing the RF power delivered to the plasma source, and modulation of the RF amplitude in the form of a square wave using a FRO, capable of achieving an accuracy of 1%, have already been discussed earlier herein. The ultimate purpose, however, is to control the plasma density in a manner similar to control of the RF amplitude. This requires in situ monitoring of the plasma density to provide feedback for a control system that adjusts the RF amplitude.

In addition to pulsing gas injection and RF power levels, plasma processing operations according to the invention can also including varying the processing chamber pressure from one gas or power level pulse to another or during each such pulse.

Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A method for performing a plasma-assisted treatment on a substrate in a reactor chamber, comprising:
   introducing a first process gas into the reactor chamber during a first time period and introducing a second process gas having a different composition than the first process gas during a second time period which follows the first time period;
   creating a plasma within the reactor chamber by establishing an RF electromagnetic field within the chamber and allowing the field to interact with the first and second process gases; and
   causing the electromagnetic field to have an energy level which varies cyclically between at least two values each sufficient to maintain the plasma, such that each energy level value is associated with performance of a respectively different treatment process on the substrate.

2. The method according to claim 1 wherein, in said step of causing, the energy level of the electromagnetic field is caused to vary according to a non-square wave function.

3. The method according to claim 1 wherein, in said step of causing, the energy level of the electromagnetic field is caused to vary according to a sinusoidal, ramp, or stepped function.

4. The method according to claim 1 wherein, in said step of causing, the energy level of the electromagnetic field is caused to vary among at least three values each sufficient to maintain the plasma.

5. The method according to claim 1 wherein, in said step of causing, the energy level of the electromagnetic field is caused to vary periodically with respectively different repetition periods during respectively different time intervals.

6. The method according to claim 1 further comprising maintaining a cyclically varying gas pressure in the process chamber.

7. The method according to claim 1 further comprising withdrawing substantially the entirety of one of the process gases which has been previously introduced from the reactor chamber before introducing the other one of the process gases into the reactor chamber.

8. The method according to claim 7 wherein said step of causing the electromagnetic field to vary cyclically is carried out for causing the energy level to have a first one of the two values during a major portion of the first time period and a second one of the two values during a major portion of the second time period.

9. The method according to claim 8 wherein said steps of introducing a first process gas and introducing a second process gas are repeated in a cyclic manner.

10. The method according to claim 9 wherein each time period has a duration of less than 100 msec.

11. The method according to claim 10 wherein the substrate is a wafer mounted on a chuck and further comprising applying an RF bias voltage to the chuck.

12. The method according to claim 11 wherein said step of applying an RF bias voltage comprises varying the RF bias voltage cyclically between two values.

13. The method according to claim 12 wherein the RF bias voltage is varied in synchronism with cyclic variations of the RF field intensity.

14. The method according to claim 9 wherein, in said steps of introducing a first process gas and introducing a second process gas, each process gas is introduced at a flow rate which varies according to a non-square wave function.

15. The method according to claim 9 wherein, in said steps of introducing a first process gas and introducing a second process gas, each process gas is introduced at a flow rate which varies according to a sinusoidal, ramp, or stepped function.

16. The method according to claim 1 further comprising introducing at least a third process gas having a different composition than each of the first and second process gasses during a third time period which follows the second time period.

17. The method according to claim 1 further comprising maintaining a cyclically varying gas pressure in the process chamber.

18. A reactor for performing a plasma-assisted treatment on a substrate, said reactor comprising:
   a chamber enclosing a plasma region;
   a gas injection assembly immediately proximate the plasma region, said gas injection assembly configured to introduce a first process gas into said chamber during a first time period and introduce a second process gas having a different composition than the first process gas during a second time period which follows the first time period;

an RF source power supply configured to create an RF electromagnetic field in the plasma region, which field interacts with at least one of the first and second process gases to create a plasma, the field having an energy level which varies cyclically between at least two values each sufficient to maintain the plasma;

a support member configured to support the substrate in the chamber in communication with the plasma region; and a vacuum pump communicating with the plasma region, said vacuum chamber adapted to withdraw process gas at a rate to maintain a selected vacuum pressure in the plasma region, wherein said gas injection assembly comprises a gas injection plate provided with a plurality of gas injection nozzles, a plurality of gas injection valves, each configured to supply at least one of the first or second process gases to at least one respective one of said nozzles, and a plurality of valve controllers coupled to said plurality of gas injection valves to cause the first or second process gas to be supplied to each of said nozzles in an intermittent manner.

19. The reactor according to claim 18 further comprising:

an RF bias power supply operatively connected to the support member and being configured to generate a direct current (DC) self-bias to attract ions to the substrate, the DC self-bias having an energy level which varies cyclically between at least two values.

20. The reactor according to claim 18 wherein said plurality of valve controllers are operative to introduce said first and second process gases into said chamber in the form of pulses.

21. The reactor according to claim 18 wherein each of said plurality of gas injection valves is an electromagnetic or piezo-electric device.

22. The reactor according to claim 18 wherein each of said plurality of gas injection valves is connected to supply gas to a single respective one of said plurality of gas injection nozzles.

23. The reactor according to claim 18 wherein each of said plurality of gas injection valves is connected to supply gas to a respective plurality of said plurality of gas injection nozzles.

24. The reactor according to claim 18 wherein each of said plurality of gas injection nozzles is a supersonic injection nozzle.

25. The reactor according to claim 18 wherein said gas injection plate is further provided with a plurality of exhaust orifices through which the first or second process gas flows from said plasma region to said vacuum pump.

* * * * *

UNITED STATES PATENT AND TRADEMARK OFFICE
CERTIFICATE OF CORRECTION

PATENT NO. : 7,166,233 B2  Page 1 of 1
APPLICATION NO. : 10/076099
DATED : January 23, 2007
INVENTOR(S) : Wayne L. Johnson et al.

It is certified that error appears in the above-identified patent and that said Letters Patent is hereby corrected as shown below:

Col. 27, line 14
replace "said vacuum chamber adapted to withdraw process gas"
with --said vacuum pump adapted to withdraw process gas--.

Signed and Sealed this

Third Day of July, 2007

JON W. DUDAS
*Director of the United States Patent and Trademark Office*